(12) United States Patent
Ching et al.

(10) Patent No.: US 10,453,961 B2
(45) Date of Patent: Oct. 22, 2019

(54) STRUCTURE AND METHOD FOR SRAM FINFET DEVICE

(71) Applicant: TAIWAN SEMICONDUCTOR MANUFACTURING COMPANY, LTD., Hsin-Chu (TW)

(72) Inventors: Kuo-Cheng Ching, Zhubei (TW); Ka-Hing Fung, Zhudong Township (TW); Zhiqiang Wu, Chubei (TW); Carlos H. Diaz, Mountain View, CA (US)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/953,768

(22) Filed: Nov. 30, 2015

(65) Prior Publication Data

US 2016/0079427 A1    Mar. 17, 2016

Related U.S. Application Data

(62) Division of application No. 14/317,907, filed on Jun. 27, 2014, now Pat. No. 9,224,736.

(51) Int. Cl.
*H01L 29/78* (2006.01)
*H01L 27/092* (2006.01)
(Continued)

(52) U.S. Cl.
CPC .... *H01L 29/7849* (2013.01); *H01L 21/02161* (2013.01); *H01L 21/02164* (2013.01);
(Continued)

(58) Field of Classification Search
CPC .......... H01L 29/7849; H01L 29/66795; H01L 29/66545; H01L 29/0649; H01L 29/785;
(Continued)

(56) References Cited

U.S. PATENT DOCUMENTS 6,359,311 B1  3/2002  Colinge et al.
8,106,464 B2  1/2012  Cho et al.
(Continued)

FOREIGN PATENT DOCUMENTS

JP    2009259865 A    11/2009
TW    201125043 A1    7/2011
WO    WO 2007085996 A2 *  8/2007  ....... H01L 29/66795

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.
(Continued)

*Primary Examiner* — Dale E Page
*Assistant Examiner* — Quovaunda Jefferson
(74) *Attorney, Agent, or Firm* — Haynes and Boone, LLP

(57) ABSTRACT

The present disclosure provides an embodiment of a fin-like field-effect transistor (FinFET) device. The device includes a first fin structure disposed over an n-type FinFET (NFET) region of a substrate. The first fin structure includes a silicon (Si) layer, a silicon germanium oxide (SiGeO) layer disposed over the silicon layer and a germanium (Ge) feature disposed over the SiGeO layer. The device also includes a second fin structure over the substrate in a p-type FinFET (PFET) region. The second fin structure includes the silicon (Si) layer, a recessed silicon germanium oxide (SiGeO) layer disposed over the silicon layer, an epitaxial silicon germanium (SiGe) layer disposed over the recessed SiGeO layer and the germanium (Ge) feature disposed over the epitaxial SiGe layer.

20 Claims, 31 Drawing Sheets

(51) Int. Cl.

| | | |
|---|---|---|
| *H01L 29/16* | (2006.01) | |
| *H01L 29/161* | (2006.01) | |
| *H01L 29/165* | (2006.01) | |
| *H01L 29/267* | (2006.01) | |
| *H01L 29/49* | (2006.01) | |
| *H01L 29/51* | (2006.01) | |
| *H01L 21/02* | (2006.01) | |
| *H01L 21/324* | (2006.01) | |
| *H01L 27/11* | (2006.01) | |
| *H01L 21/8238* | (2006.01) | |
| *H01L 29/06* | (2006.01) | |
| *H01L 29/66* | (2006.01) | |

(52) U.S. Cl.
CPC .. *H01L 21/02236* (2013.01); *H01L 21/02532* (2013.01); *H01L 21/324* (2013.01); *H01L 21/823807* (2013.01); *H01L 21/823821* (2013.01); *H01L 27/0922* (2013.01); *H01L 27/0924* (2013.01); *H01L 27/1104* (2013.01); *H01L 29/0649* (2013.01); *H01L 29/16* (2013.01); *H01L 29/161* (2013.01); *H01L 29/165* (2013.01); *H01L 29/267* (2013.01); *H01L 29/495* (2013.01); *H01L 29/4966* (2013.01); *H01L 29/517* (2013.01); *H01L 29/66545* (2013.01); *H01L 29/66795* (2013.01); *H01L 29/785* (2013.01); *H01L 29/7848* (2013.01); *H01L 21/823814* (2013.01); *H01L 2029/7858* (2013.01)

(58) Field of Classification Search
CPC ..... H01L 29/16; H01L 29/161; H01L 29/165; H01L 29/267; H01L 29/495; H01L 29/4966; H01L 29/517; H01L 29/7848; H01L 21/02236; H01L 21/02161; H01L 21/02164; H01L 21/324; H01L 21/02532; H01L 21/823807; H01L 2029/7858; H01L 27/0924; H01L 27/0922; H01L 27/1104

See application file for complete search history.

(56) References Cited

U.S. PATENT DOCUMENTS

| | | | |
|---|---|---|---|
| 8,901,607 B2 | 12/2014 | Wang et al. | |
| 9,159,833 B2 | 10/2015 | Ching et al. | |
| 9,209,185 B2 * | 12/2015 | Ching | H01L 29/16 |
| 2005/0023619 A1 * | 2/2005 | Orlowski | H01L 29/42384 |
| | | | 257/401 |
| 2005/0056892 A1 * | 3/2005 | Seliskar | H01L 21/84 |
| | | | 257/348 |
| 2008/0296702 A1 | 12/2008 | Lee et al. | |
| 2010/0025822 A1 * | 2/2010 | Pillarisetty | H01L 21/7624 |
| | | | 257/609 |
| 2010/0059807 A1 * | 3/2010 | Cho | H01L 27/10814 |
| | | | 257/306 |
| 2010/0221866 A1 * | 9/2010 | Graham | H01L 31/035227 |
| | | | 438/73 |
| 2011/0193178 A1 * | 8/2011 | Chang | H01L 29/66795 |
| | | | 257/408 |
| 2012/0276695 A1 | 11/2012 | Cheng et al. | |
| 2013/0244387 A1 * | 9/2013 | Cho | H01L 21/76224 |
| | | | 438/283 |
| 2014/0008730 A1 | 1/2014 | Mitard et al. | |
| 2015/0303198 A1 | 10/2015 | Ching | |
| 2015/0303305 A1 * | 10/2015 | Ching | H01L 29/7851 |
| | | | 257/192 |

OTHER PUBLICATIONS

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.

Tetlin et al., "Kinetics and Mechanism of Low Temperature Atomic Oxygen-Assisted Oxidation of SiGe Layers," Journal of Applied Physics, Mar. 1, 1998, pp. 2842-2846, vol. 83, No. 5, American Institute of Physics.

P. Gas et al., "Diffusion of Sb, Ga, Ge, and (AS) in TiSi2," Journal of Applied Physics, Jun. 1, 1988, pp. 5335-5345, vol. 63, No. 11, American Institute of Physics.

U.S. Appl. No. 13/934,992, filed Jul. 3, 2013, by inventors Kuo-Cheng Ching, Chih-Hao Wang, Zhiqiang Wu and Carlos H. Diaz for "Fin Structure of Semiconductor Device," 21 pages of text, 12 pages of drawings.

U.S. Appl. No. 13/740,373, filed Jan. 14, 2013, by inventors Chih-Hao Wang, Kuo-Cheng Ching, Gwan Sin Chang, and Zhiqiang Wu for "Semiconductor Device and Fabricating the Same," 21 pages of text, 17 pages of drawings.

U.S. Appl. No. 13/902,322, filed May 24, 2013, by inventors Chih-Hao Wang, Kuo-Cheng Ching, Gwan Sin Chang, and Zhiqiang Wu for "FinFET Device and Method of Fabricating Same," 20 pages of text, 15 pages of drawings.

U.S. Appl. No. 14/155,793, filed Jan. 15, 2014, by inventors Kuo-Cheng Ching, Chih-Hao Wang, Zhiqiang Wu and Carlos H. Diaz for "Semiconductor Device and Formation Thereof," 16 pages of text, 12 pages of drawings.

U.S. Appl. No. 14/254,072, filed Apr. 16, 2014, by inventors Kuo-Cheng Ching, Ka-Hing Fung, Chih-Sheng Chang, and Zhiqiang Wu for "A Method and Structure for FinFET Device," 26 pages of text, 14 pages of drawings.

U.S. Appl. No. 14/254,035, filed Apr. 16, 2014, by inventors Kuo-Cheng Ching, Ka-Hing Fung, Chih-Sheng Chang, and Zhiqiang Wu for "FinFET Device with High-K Metal Gate Stack," 22 pages of text, 14 pages of drawings.

Notice of Allowance for Korean Application No. 10-2017-0040016 dated Apr. 18, 2017, 7 pgs.

* cited by examiner

STRUCTURE AND METHOD FOR SRAM FINFET DEVICE

This application is a divisional application of U.S. patent application Ser. No. 14/317,907, filed Jun. 27, 2014 which is related to patent application U.S. Ser. No. 13/740,373 filed on Jan. 14, 2013, as "Semiconductor Device and Fabricating the Same;" U.S. Ser. No. 13/902,322 filed on May 24, 2013, as "FinFET Device and Method of Fabricating Same;" U.S. Ser. No. 13/934,992 filed on Jul. 3, 2013, as "Fin Structure of Semiconductor Device;" U.S. Ser. No. 14/155,793 filed on Jan. 15, 2014, as "Semiconductor Device and Formation Thereof;" U.S. Ser. No. 14/254,072 filed on Apr. 16, 2014, as "A Method and Structure for FinFET Device;" and U.S. Ser. No. 14/254,035 filed on Apr. 16, 2014, as "FinFET Device With High-K Metal Gate Stack" the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

Figure 1:
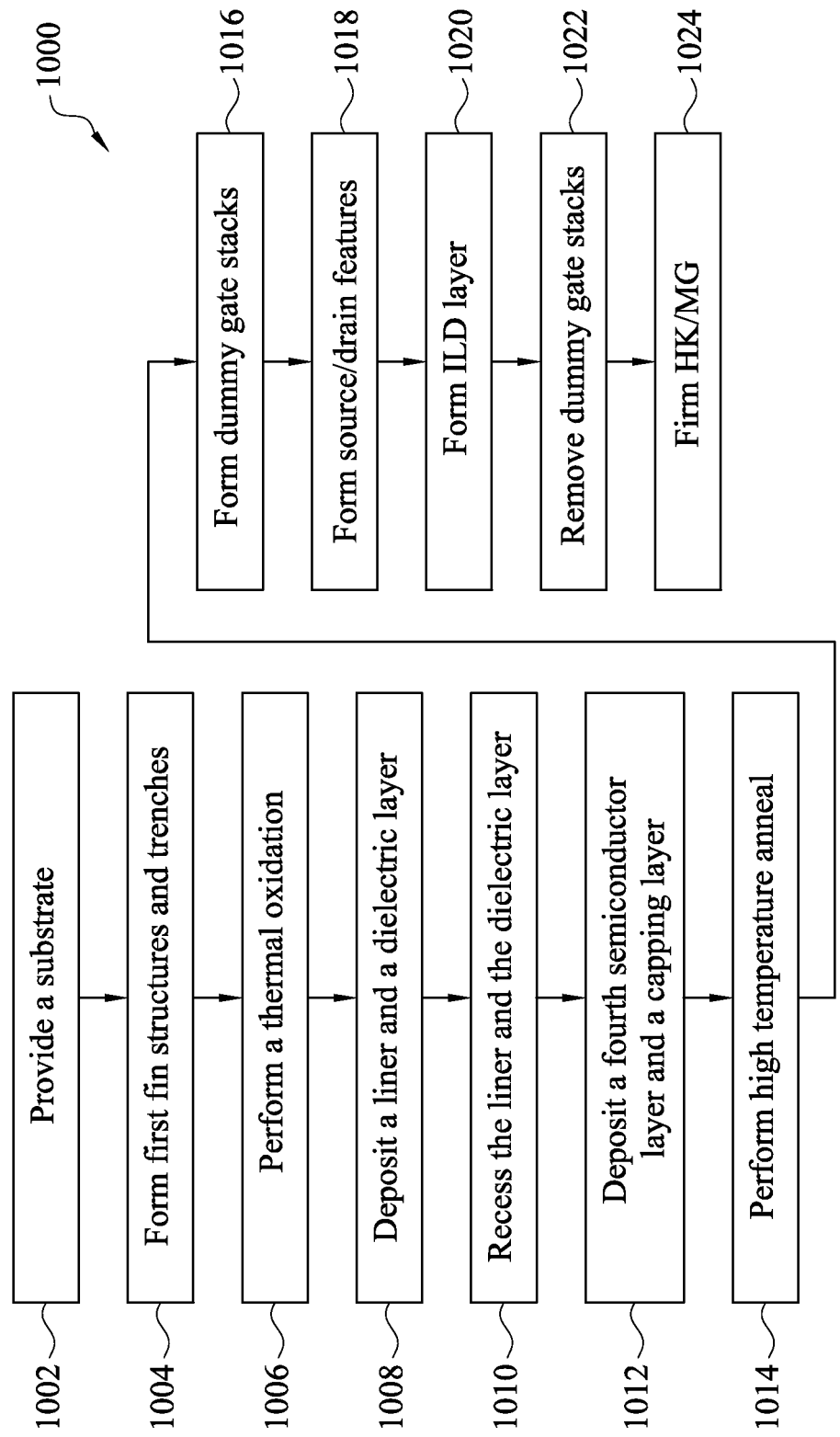
FIG. 1 is a flow chart of an example method for fabricating a FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 1000 for fabricating a FinFET device 200 in accordance with some embodiments. It is understood that additional steps may be implemented before, during, and after the method, and some of the steps described may be replaced or eliminated for other embodiments of the method. The FinFET device 200 and the method 1000 making the same are collectively described with reference to various figures.

Figure 2:
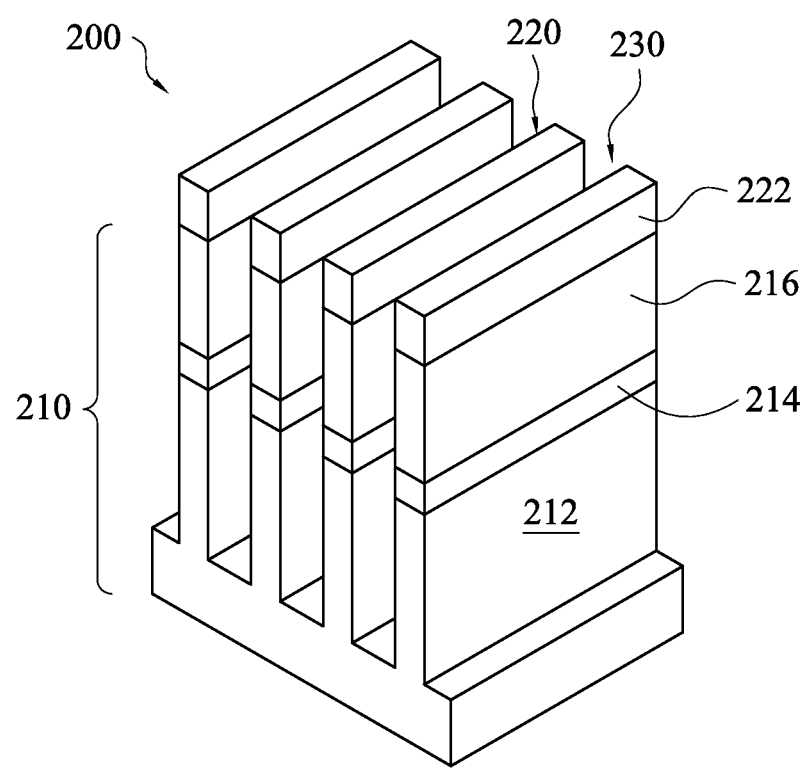
FIG. 2 is a diagrammatic perspective view of an example FinFET device undergoing processes in accordance with some embodiments.

Referring to FIGS. 1 and 2, the method 1000 begins at step 1002 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 216 has a second lattice constant different from the first lattice constant. In the present embodiment, the second semiconductor material layer 214 includes silicon germanium (SiGe), and both of the first and the third semiconductor material layers, 212 and 216, include silicon (Si). In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

Referring again to FIGS. 1 and 2, the method 1000 proceeds to step 1004 by forming first fin structures 220 and trenches 230 in the substrate 210. In one embodiment, a patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers. The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222.

The substrate 210 is then etched through the patterned FHM layer 222 to form the first fin structures 220 and the trenches 230 in the substrate 210. In another embodiment, the patterned photoresist layer is directly used the patterned FHM layer 222 as an etch mask of the etch process to form the first fin structures 220 and the trenches 230 in the substrate 210. The etching process may include a wet etch or a dry etch. In one embodiment, the wet etching solution includes a tetramethylammonium hydroxide (TMAH), a HF/HNO$_3$/CH$_3$COOH solution, or other suitable solution.

In the present embodiment, the etching depth is controlled such that the third and the second semiconductor material layers, 216 and 214 are exposed while a portion of the first semiconductor material layer 212 is exposed in the trench 230. Thus the first fin structure 220 is formed to have the third semiconductor material layer 216 as its upper portion, the second semiconductor material layer 214 as its middle portion and the first semiconductor material layer 212 as its bottom portion.

The previous discussion with respect to FIGS. 1 and 2 applies to a method of manufacturing either an n-type FinFET (NFET) device and/or a p-type FinFET (PFET) device. The process described below, discusses the process of manufacturing either an NFET device and/or a PFET device. In some embodiment, the FinFET device 200 includes an NFET device, designated with the reference numeral 200A and referred to as the NFET device 200A. The FinFET device 200 also includes a PFET device, designated with the reference numeral 200B and referred to as the PFET device 200B.

Figure 3A:
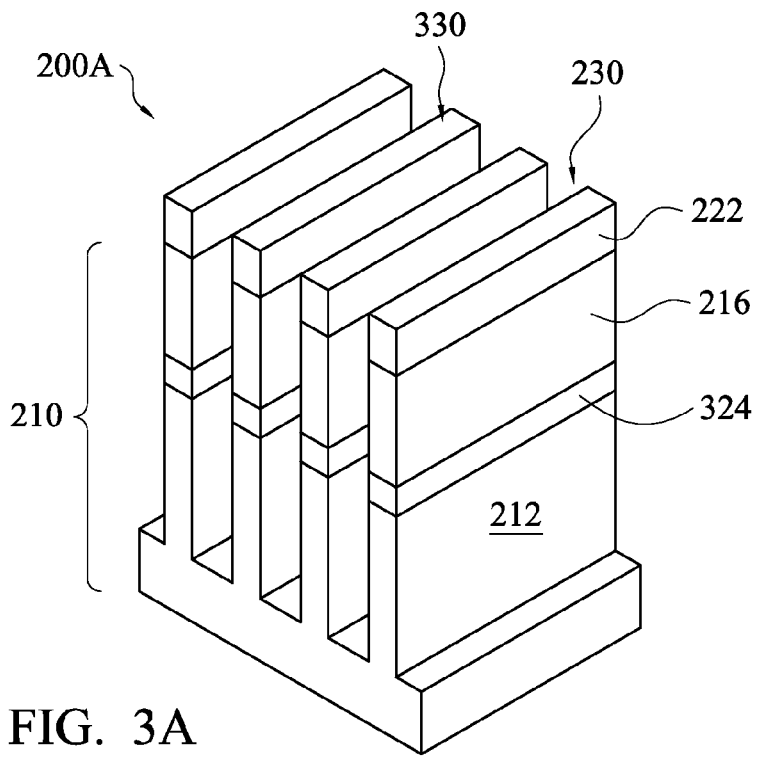
FIGS. 3A-3B, 4A-4B, 5A-5B, and 6A-6B are diagrammatic perspective views of an example FinFET device at fabrication stages constructed according to the method of FIG. 1.
Figure 3B:
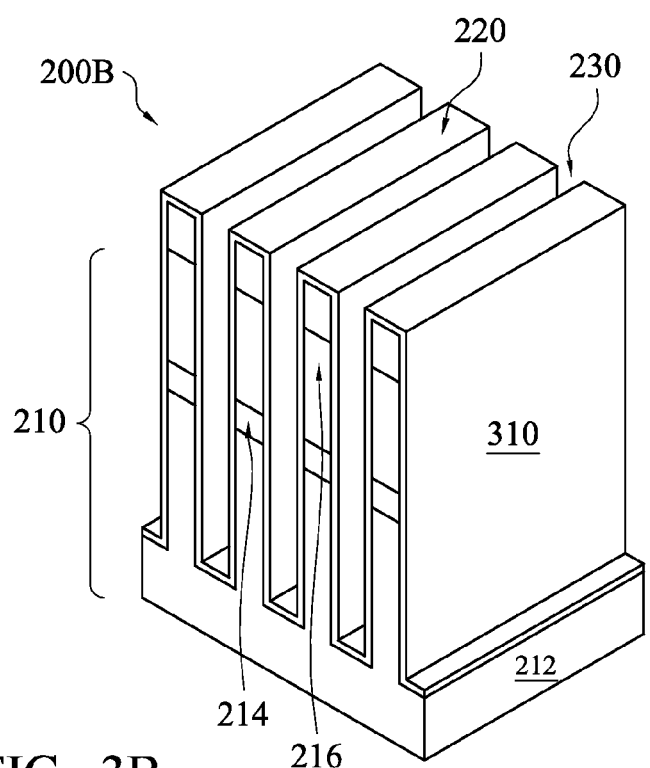

Referring to FIGS. 1 and 3A-3B, the method 1000 proceeds to step 1006 by converting the second semiconductor material layer 214 in the NFET device 200A into a semiconductor oxide layer 324. In one embodiment, first a patterned oxidation-hard-mask (OHM) 310 is formed over the substrate 210, including wrapping a portion of the first fin structures 220. The patterned OHM 310 covers the PFET 200B while leaving the NFET device 200A being uncovered during the step of converting the second semiconductor material layer 214 in the NFET device 200A into the semiconductor oxide layer 324.

The patterned OHM layer 310 may include silicon oxide, silicon nitride, silicon oxynitride, or any other suitable dielectric material. The patterned OHM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned OHM layer 310.

In the present embodiment, a thermal oxidation process is performed to convert the second semiconductor material layer 214 in the NFET device 200A to the semiconductor oxide layer 324. In one embodiment, the thermal oxidation process is conducted in oxygen ambient. In another embodiment, the thermal oxidation process is conducted in a combination of steam ambient and oxygen ambient. In one embodiment, the thermal oxidation process is controlled such that the second semiconductor material layer 214 oxidizes much faster that the first and third semiconductor material layers, 212 and 216. Therefore outer layers of the first and third semiconductor material layers, 212 and 216 oxidized are quite thin. After the oxidation process, a cleaning process is performed to remove the oxidized outer layers of the first and third semiconductor layers, 212 and 216. The cleaning process may be performed using diluted hydrofluoric (DHF) acid.

After the thermal oxidation process, the first fin structures 220 in the NFET device 200A have different structures than those in the PFET device 200B. For the sake of clarity to better description, the first fin structure 220 in the NFET device 200A is referred to as a second fin structure 330. Thus the second fin structure 330 has the third semiconductor material layer 216 as its upper portion, the semiconductor oxide layer 324 as its middle portion and the first semiconductor material layer 212 as its bottom portion. The semiconductor oxide layer 324 applies an adequate stress to the third semiconductor material layer 216 in the second fin structure 330, where a gate channel is to be defined underlying a gate region, which will be described later.

In one embodiment, the second semiconductor material layer 214 includes silicon germanium (SiGe), the semiconductor oxide layer 324 includes silicon germanium oxide (SiGeO) and both of the first and the third semiconductor material layers, 212 and 216, include silicon (Si).

In an alternative embodiment, the formation of the OHM 310 is skipped during step 1006 and the first fin structures 220 in the NFET device 200A and the PFET device 200B are exposed in the thermal oxidation. The second semiconductor material layer 214 of the first fin structures 220 in both of the NFET device 200A and the PFET device 200B are converted to the semiconductor oxide layer 324.

The following description will be directed to the embodiment, which has the semiconductor oxide layer 324 in the NFET device 200A only. Those skilled in the art should also recognize that the method 1000 would similarly apply to various embodiments, such as the embodiment, which has the semiconductor oxide layer 324 in both of the NFET device 200A and PFET device 200B.

Figure 4A:
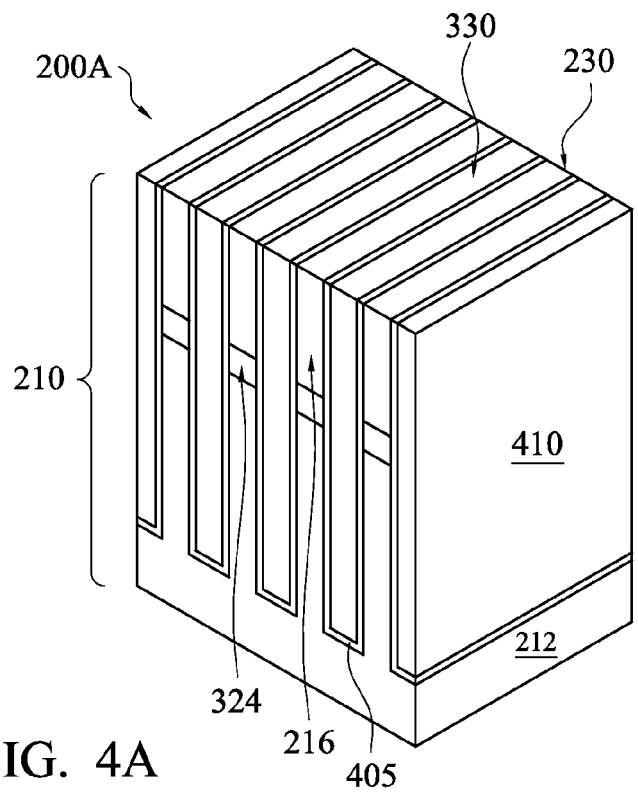
Figure 4B:
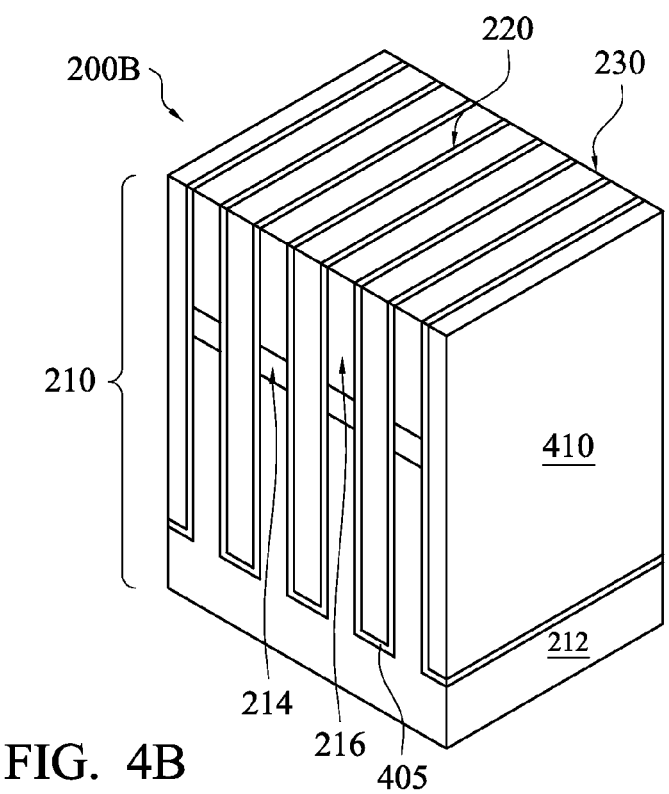

Referring to FIGS. 1 and 4A-4B, the method 1000 proceeds to step 1008 by depositing a liner 405 over the substrate 210 and then filling in the trench 230 with a dielectric layer 410 in both of the NFET 200A and the PFET 200B. First, the patterned OHM layer 310 is removed by an etching process, such as a selective wet etch. In the present embodiment, the liner 405 is then deposited over the substrate 210, including conformably wrapping over the first and second fin structures 220 and 330. The liner 405 may include silicon nitride, silicon oxynitride, aluminum oxide, or other suitable materials. In one embodiment, the liner 405 is deposited by ALD to achieve adequate film coverage of wrapping over the first and second fin structures 220 and 330. Alternatively, the liner 405 may be deposited by CVD, physical vapor deposition (PVD), or other suitable techniques. In the present embodiment, the liner 405 is designed to be a buffer layer to prevent the second semiconductor material layer 214 be oxidized further in the downstream or later processed and a barrier of out-diffusion of the second semiconductor material layer 214, which will be described in detail below.

The dielectric layer 410 is deposited over the liner 405 in the substrate 210, including filling in the trench 230, in both of the NFET 200A and the PFET 200B. The dielectric layer 410 may include silicon oxide, silicon nitride, silicon oxynitride, spin-on-glass, spin-on-polymer, or other suitable materials, or combinations thereof. The dielectric layer 410 may be deposited by CVD, physical vapor deposition (PVD), ALD, thermal oxidation, spin-on coating, or other suitable techniques, or a combination thereof. As has been mentioned previously, having the liner 405 cover the first and second fin structures 220 and 330, it provides a buffer to adverse impacts induced during the formation of the dielectric layer 410, such as in thermal curing process for the dielectric layer 410.

A CMP process may be performed thereafter to remove excessive liner 405 and the dielectric layer 410, as well as the FHM 222 and planarize the top surface of the NFET device 200A and the PFET device 200B.

Figure 5A:
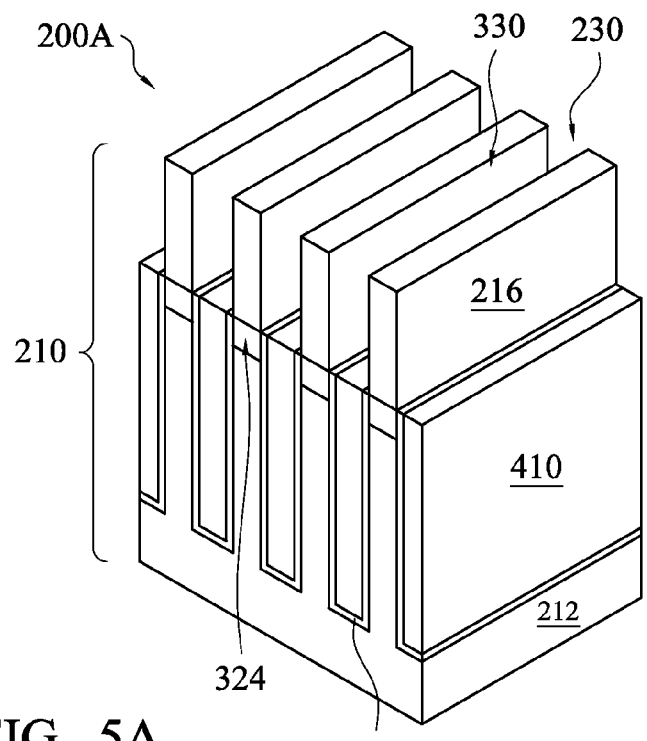
Figure 5B:
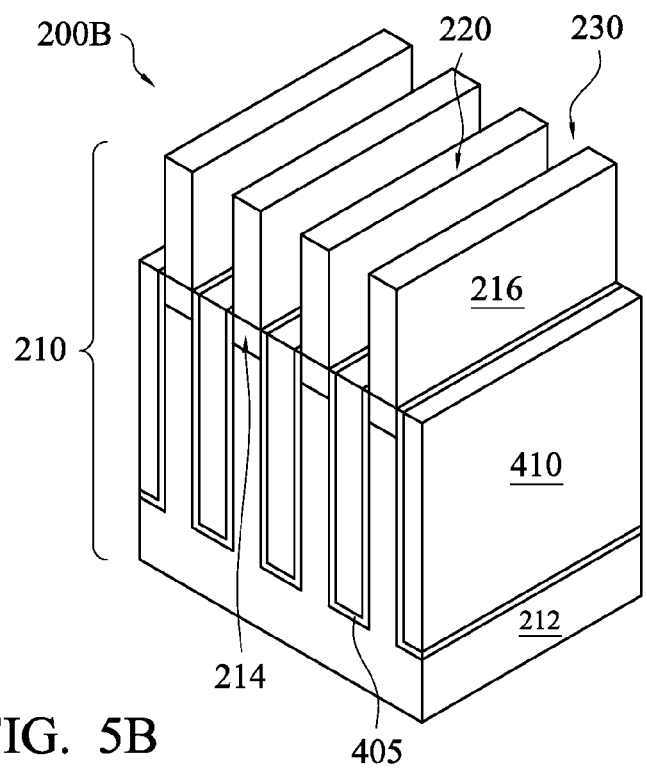

Referring to FIGS. 1 and 5A-5B, the method 1000 proceeds to step 1010 by recessing the liner 405 and the dielectric layer 410 in both of the NFET device 200A and the PFET device 200B. The liner 405 and the dielectric layer 410 are recessed by proper etching processes, such as a selective wet etch, a selective dry etch, or a combination thereof. Alternatively, the liner 405 and the dielectric layer 410 are recessed through a patterned photoresist layer formed over the NFET device 200A and the PFET device 200B. In present embodiment, the recessing processes are controlled to fully expose the third semiconductor layer 216 in both NFET device 200A and PFET device 200B.

Figure 6A:
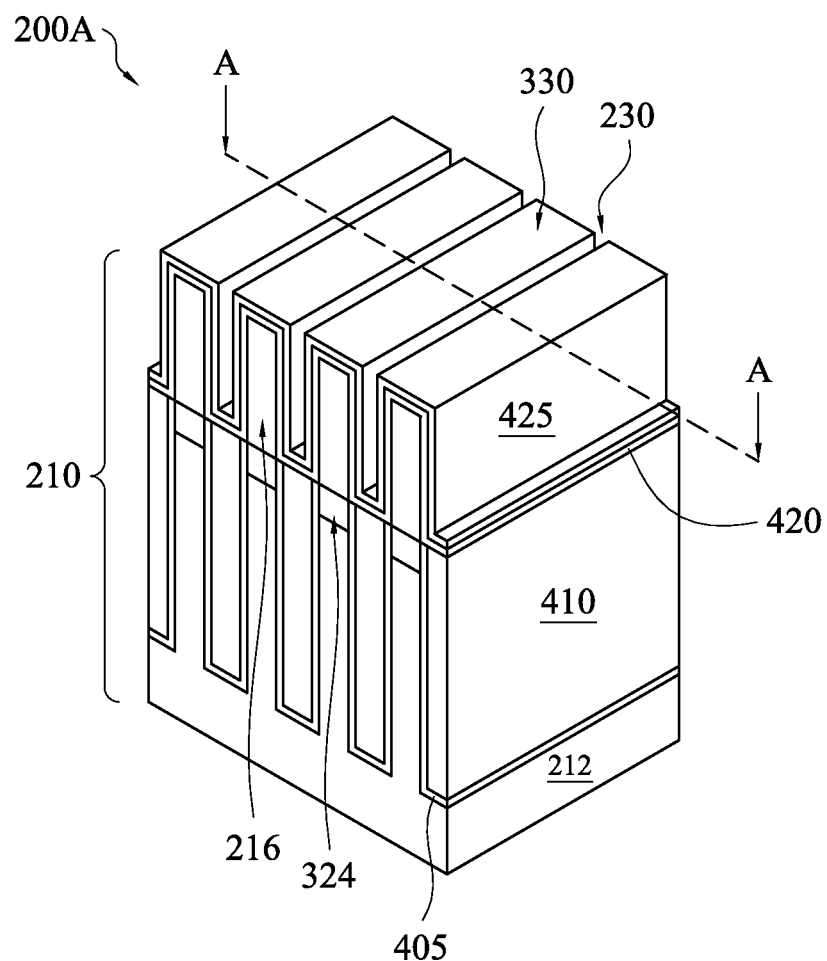
Figure 6B:
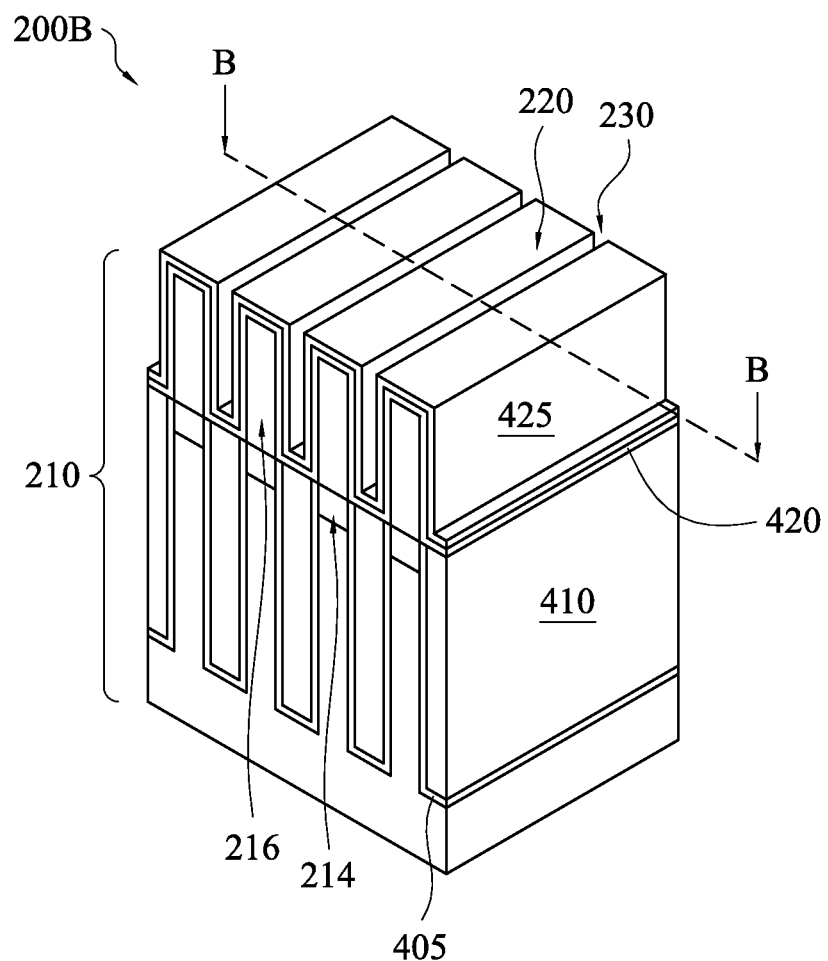

Referring to FIGS. 1 and 6A-6B, the method 1000 proceeds to step 1012 by wrapping over the exposed third semiconductor material layer 216 in the first and second fin structures, 220 and 330 by a fourth semiconductor material layer 420 and an oxide capping layer 425 over the fourth semiconductor material layer 420. In one embodiment, the fourth semiconductor material layer 420 includes a Ge layer while the third semiconductor material layer includes Si layer. In another embodiment, the fourth semiconductor material layer 420 includes SiGe layer while the third semiconductor material layer includes Si layer. The fourth semiconductor material layer 420 and the oxide capping layer 425 may be deposited by CVD, ALD, PVD, or other suitable processes.

Figure 7A:
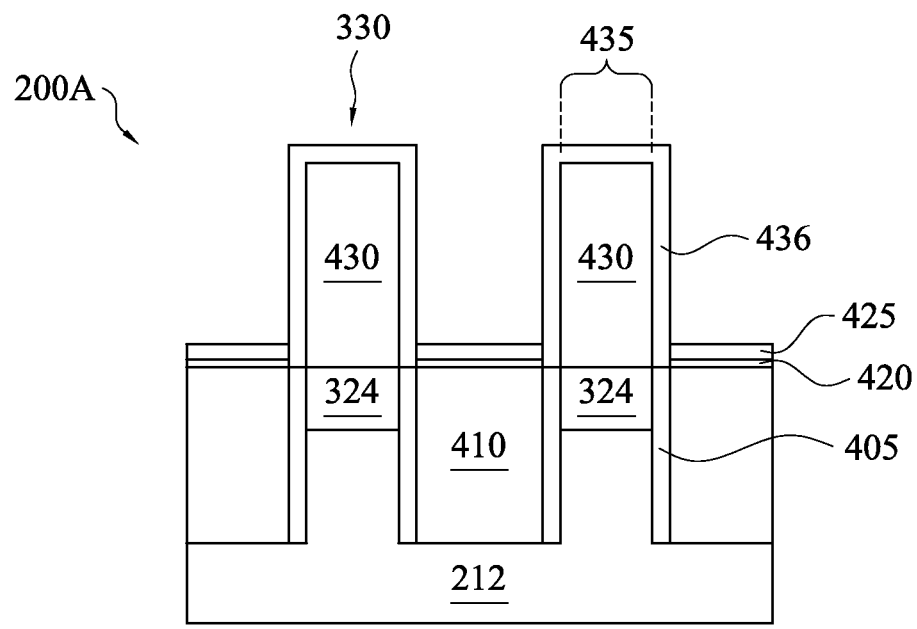
FIG. 7A is a cross-sectional view of an example FinFET device alone the line A-A in FIG. 6A at fabrication stages constructed according to the method of FIG. 1.
Figure 7B:
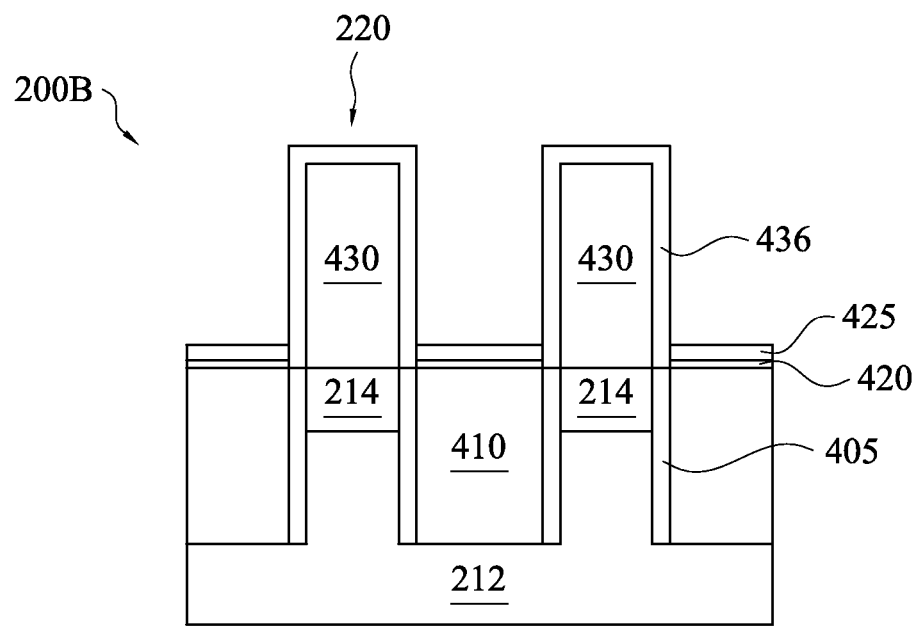
FIG. 7B is a cross-sectional view of an example FinFET device alone the line B-B in FIG. 6B at fabrication stages constructed according to the method of FIG. 1.
Figure 7C:
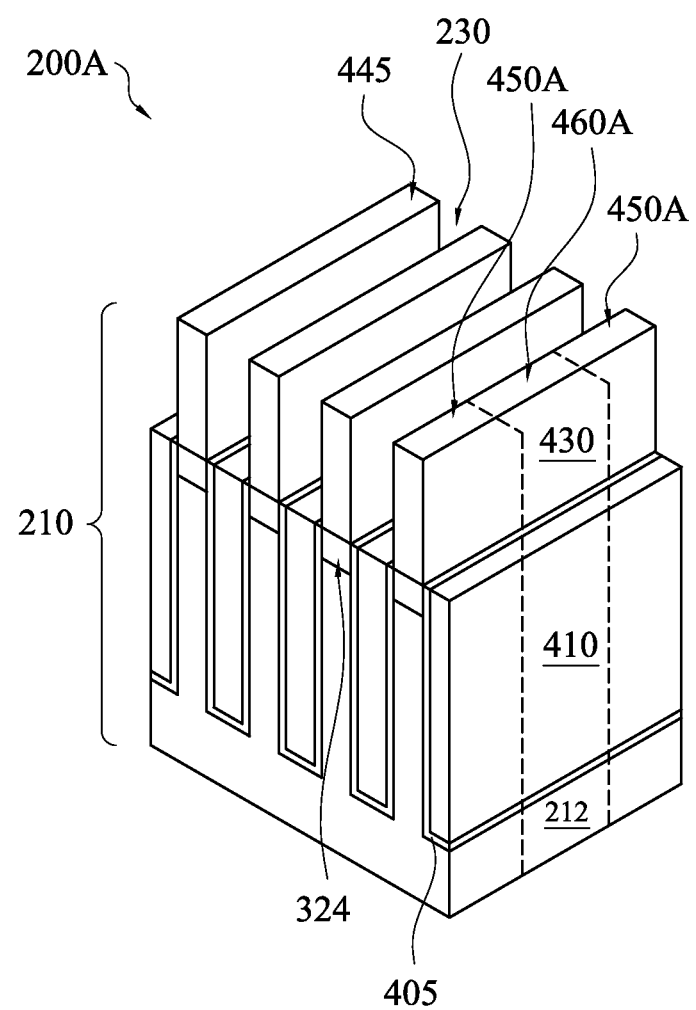
FIGS. 7C-7D, 8A-8B, 9A-9B, 10A-10B and 11A-11B are diagrammatic perspective views of a FinFET device undergoing processes in accordance with some embodiments.
Figure 7D:
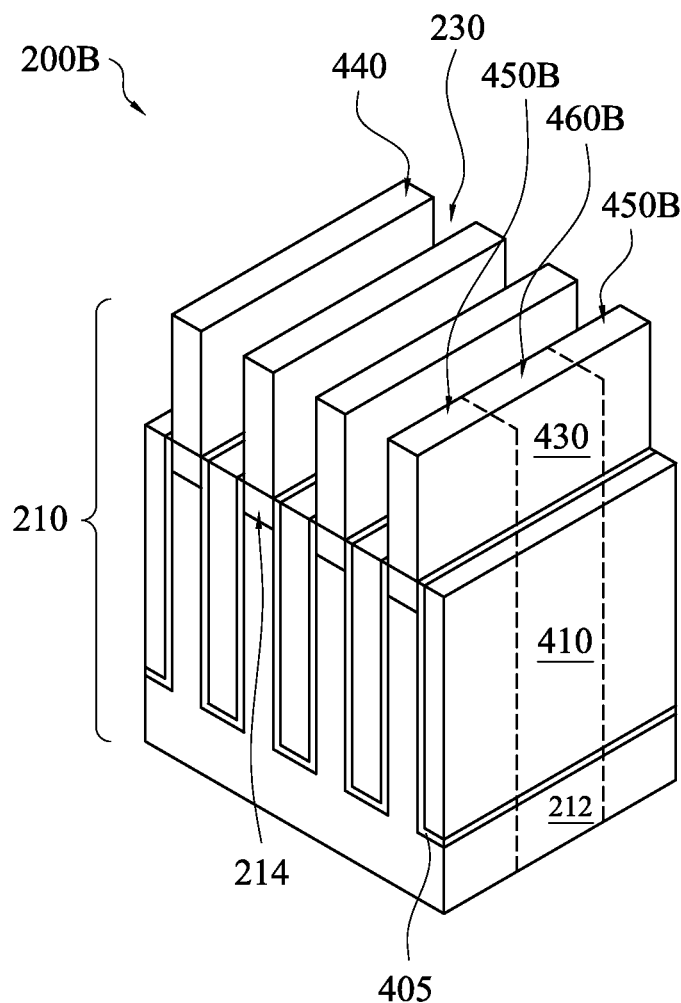

Referring to FIGS. 1 and 7A-7B, the method 1000 proceeds to step 1014 by performing a high temperature anneal to condense Ge to form Ge features 430 as the upper portion of the first and second fin structures, 220 and 330. In one embodiment, the temperature range is from about 800° C. to about 1100° C. In the present embodiment, the third semiconductor material layer 216 is Si layer and the fourth semiconductor material layer 420 is Ge layer, or SiGe layer. During the high temperature anneal, Ge condenses from the Ge (or the SiGe) layer 420 to concentrate in a middle section 435 of the upper portion, while silicon oxide layer is formed an as outer layer 436 of the upper portion of the first and second fin structures, 220 and 330. In the present embodiment, the high temperature annealing process is controlled to have the middle section 435 of the upper portion be pure Ge feature 430. After the anneal process, the silicon oxide outer layer 436 is removed by a suitable etching process, such as a selective wet etch. Therefore, the Ge feature 430 replaced the third semiconductor material layer 216 as the upper portions of the first and second fin structures, 220 and 330, referred to as a third and a fourth fin structures, 440 and 445, respectively, as shown in FIGS. 7C and 7D. The Ge feature 430 formed by condensing Ge in a high temperature anneal provides advantage of low epitaxial defects.

In some embodiments, the FinFET device 200 includes source/drain (S/D) regions and gate regions. In furtherance of the embodiment, one of the S/D regions is a source region, and another of the S/D regions is a drain region. The S/D regions are separated by the gate region. For the sake of clarity to better description, the S/D regions and the gate regions in the NFET device 200A are referred to as a first S/D regions 450A and a first gate regions 460A; the S/D regions and the gate regions in the PFET device 200B are referred to as a second S/D regions 450B and a second gate regions 460B.

Figure 8A:
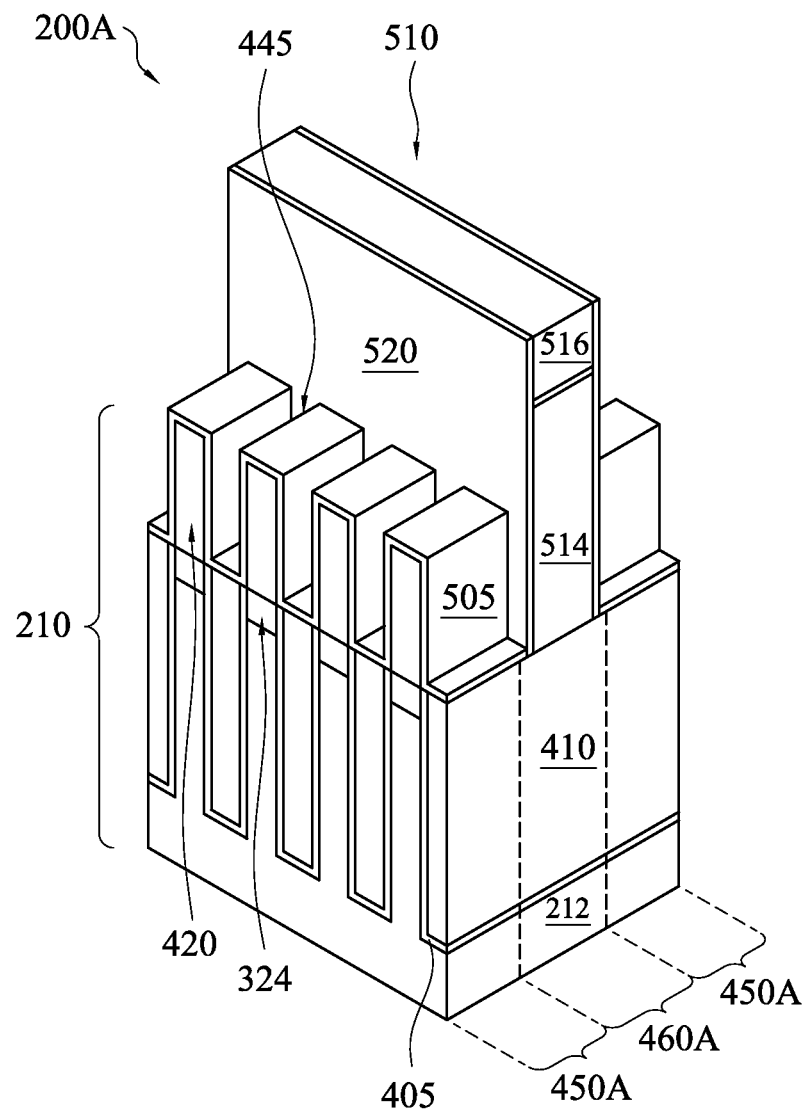
Figure 8B:
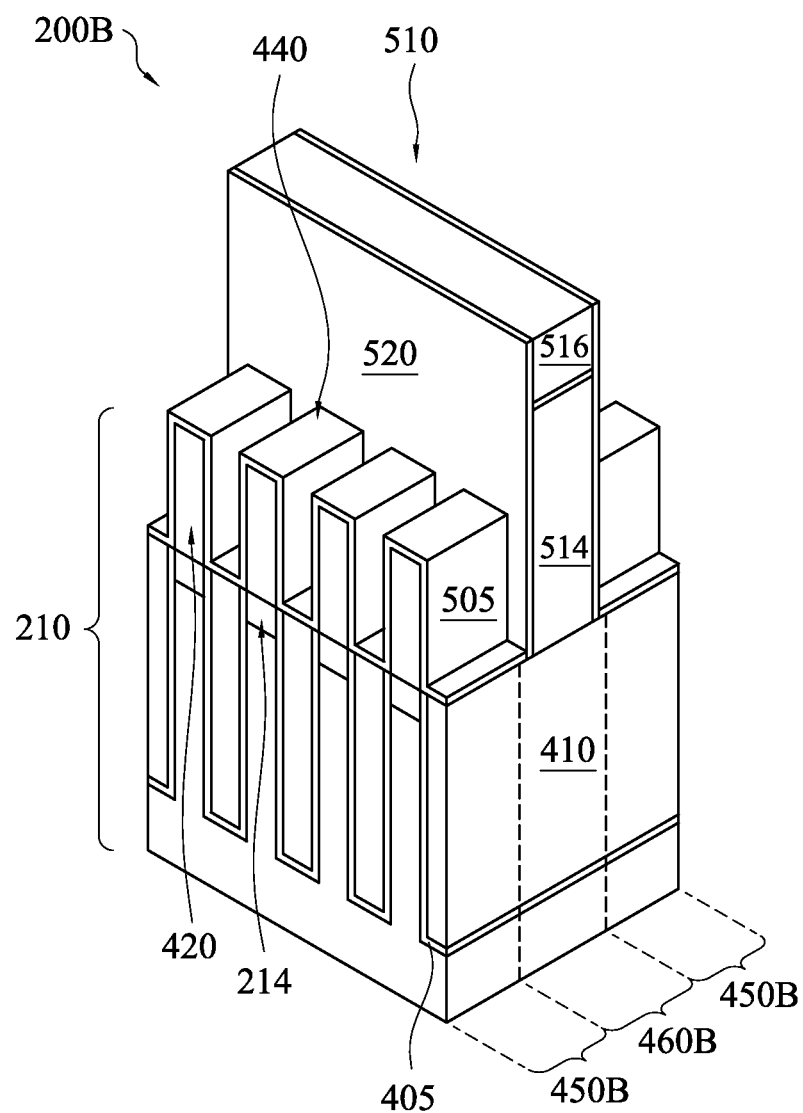

Referring to FIGS. 1 and 8A-8B, the method 1000 proceeds to step 1016 by forming a gate stack 510 and sidewall spacers 520 on sidewalls of the gate stack 510, in the first and second gate regions, 460A and 460B. In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation.

In one embodiment, a dummy dielectric layer 505 is deposited over the substrate 210, including wrapping over the third and fourth fin structures, 430 and 440. The dummy dielectric layer 505 is designed to protect the third and fourth fin structures, 440 and 445 during a subsequent process of forming dummy gate stacks, which will be described later. The dummy dielectric layer 505 may be deposited by ALD, CVD, PVD and other suitable techniques. In one embodiment, the dummy dielectric layer 505 includes silicon oxide.

The dummy gate stack 510 is formed over the substrate 210 and is partially disposed over the fourth fin structure 445 in the first gate region 460A and the third fin structure 440 in the second gate region 460B. In one embodiment, the dummy gate stack 510 includes a dielectric layer 512, an electrode layer 514 and a gate hard mask (GHM) 516. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 512 includes silicon oxide. Alternatively or additionally, the dielectric layer 512 may include silicon nitride, a high-k dielectric material or other suitable material. The electrode layer 514 may include polycrystalline silicon (polysilicon). The GHM 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Figure 9A:
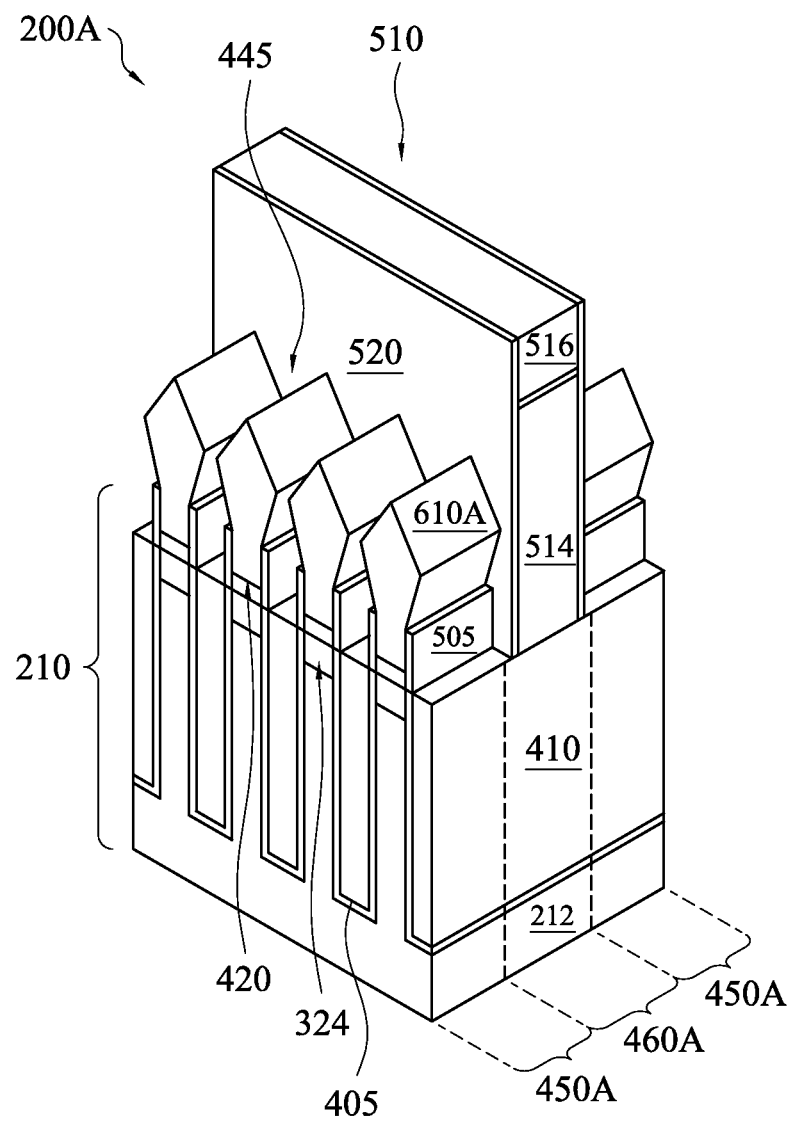
Figure 9B:
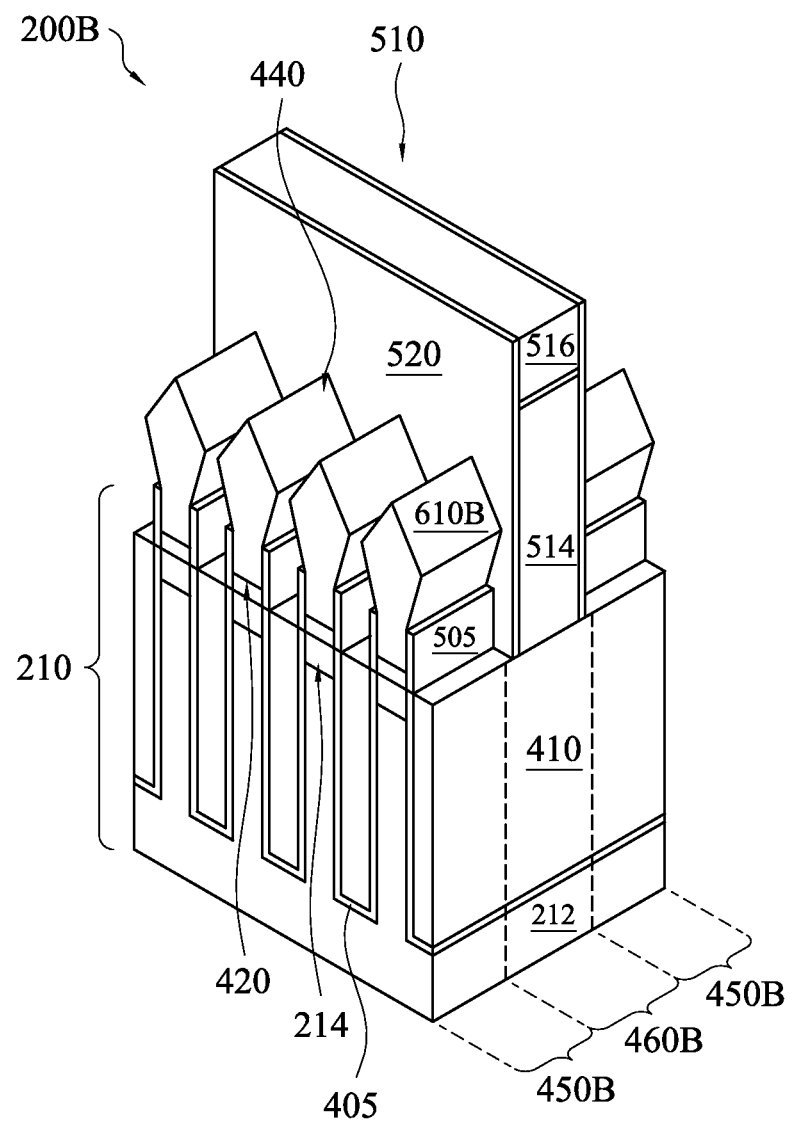

Referring to FIGS. 1 and 9A-9B, the method 1000 proceeds to step 1018 by forming a first S/D features 610A in the first S/D regions 450A and a second S/D features 610B in the second S/D regions 450B. In one embodiment, a portion of the upper portion of the fourth fin structures 445 in the first S/D region 450A and a portion of the upper portion of the third fin structures 440 in the second S/D region 450B are recessed. The recessing process is controlled to have a portion of the Ge feature 430 remain in the third and fourth fin structures, 440 and 445. The first S/D features 610A and the second S/D features 610B are then epitaxially grow on the recessed third and fourth fin structures, 440 and 450, in the first and second S/D regions 450A and 450B, respectively. The first and the second S/D features, 610A and 610B, include Ge, Si, GaAs, AlGaAs, SiGe, GaAsP, or other suitable material. The first and the second S/D features, 610A and 610B, may be formed by one or more epitaxy or epitaxial (epi) processes. The first and the second S/D features, 610A and 610B, may also be doped, such as being in-situ doped during the epi processes. Alternatively, the first and the second S/D features, 610A and 610B, are not in-situ doped and implantation processes (i.e., a junction implant process) are performed to dope the first and the second S/D features, 610A and 610B.

In one embodiment, the first S/D features 610A is formed by the epitaxially grown SiGe layer doped with phosphorous to form SiGe:P S/D features. While the second S/D features 610B is formed by the epitaxially grown GeSn layer doped with boron to form GeSnB S/D features.

Figure 10A:
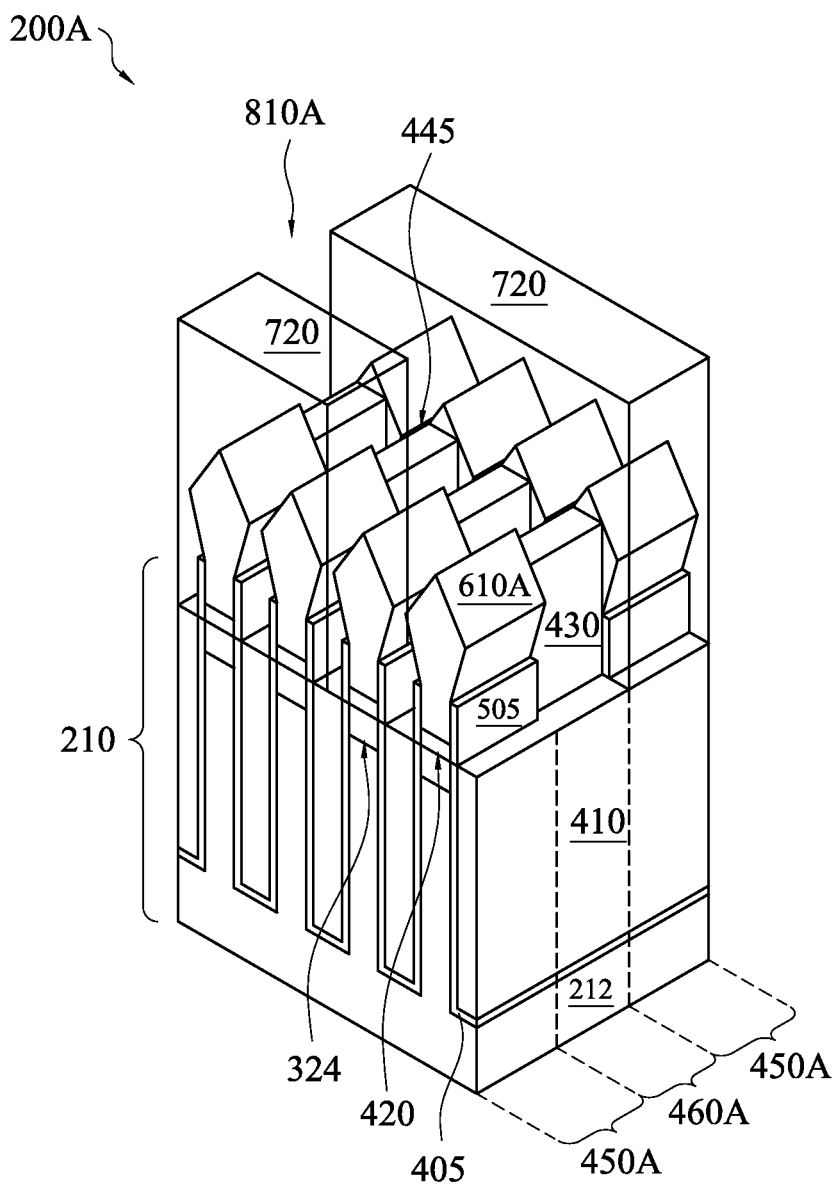
Figure 10B:
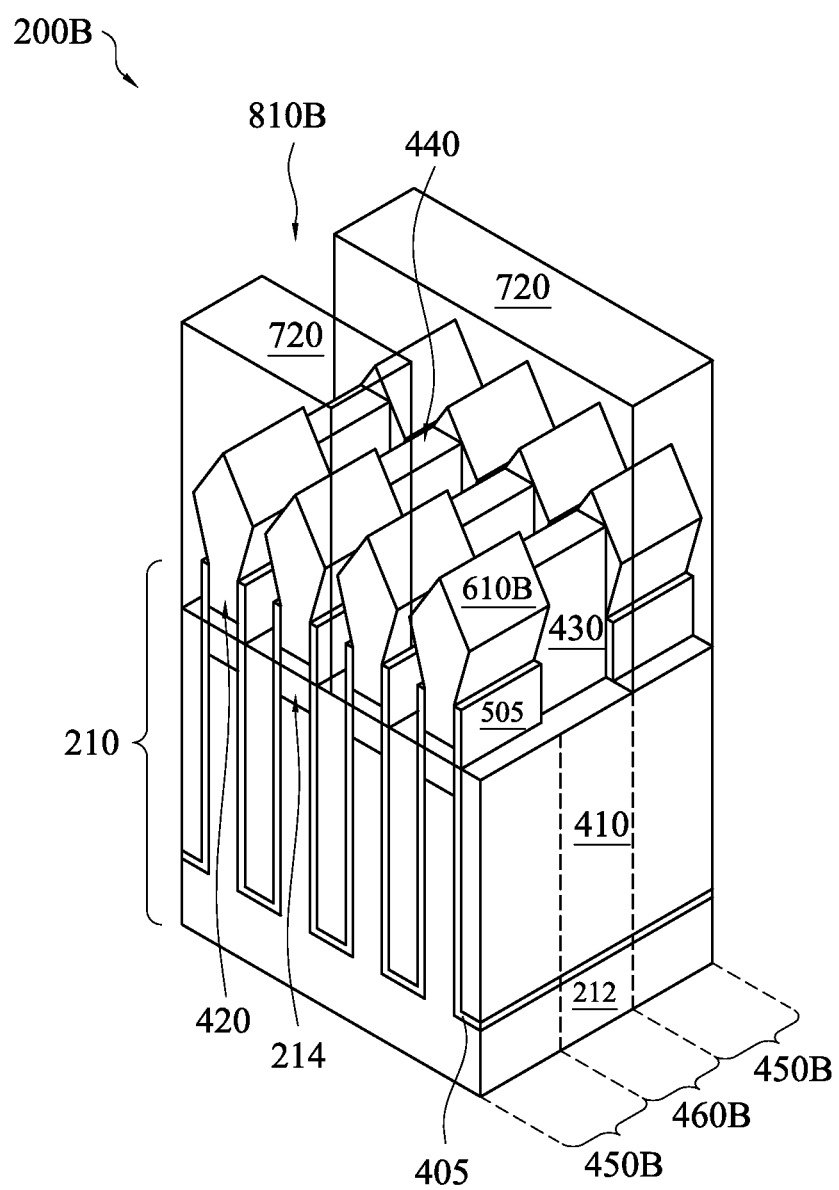

Referring to FIGS. 1 and 10A-10B, the method 1000 proceeds to step 1020 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the SRAM FinFET device 200.

Referring also to FIGS. 1 and 10A-10B, the method 100 proceeds to step 1022 by removing the dummy gate stacks 510 in the first gate region 460A to form one or more first gate trench 810A and in the second gate region 460B to form one or more second gate trench 810B. The upper portion of the second fin structure 320 is exposed in the first gate trench 810A and the upper portion of the third fin structure 440 is exposed in the second gate trench 810B. The dummy gate stacks 510 are removed by an etch process (such as selective wet etch or selective dry etch) designed to have an adequate etch selectivity with respect to the third semiconductor material layer 216 in the first gate trench 810A and the fourth semiconductor material layer 445 in the second gate trench 810B. The etch process may include one or more etch steps with respective etchants. The gate hard mask layer 516 and the spacers 520 are removed as well. Alternatively, the dummy gate stack 510 may be removed by a series of processes including photolithography patterning and etching process.

Figure 11A:
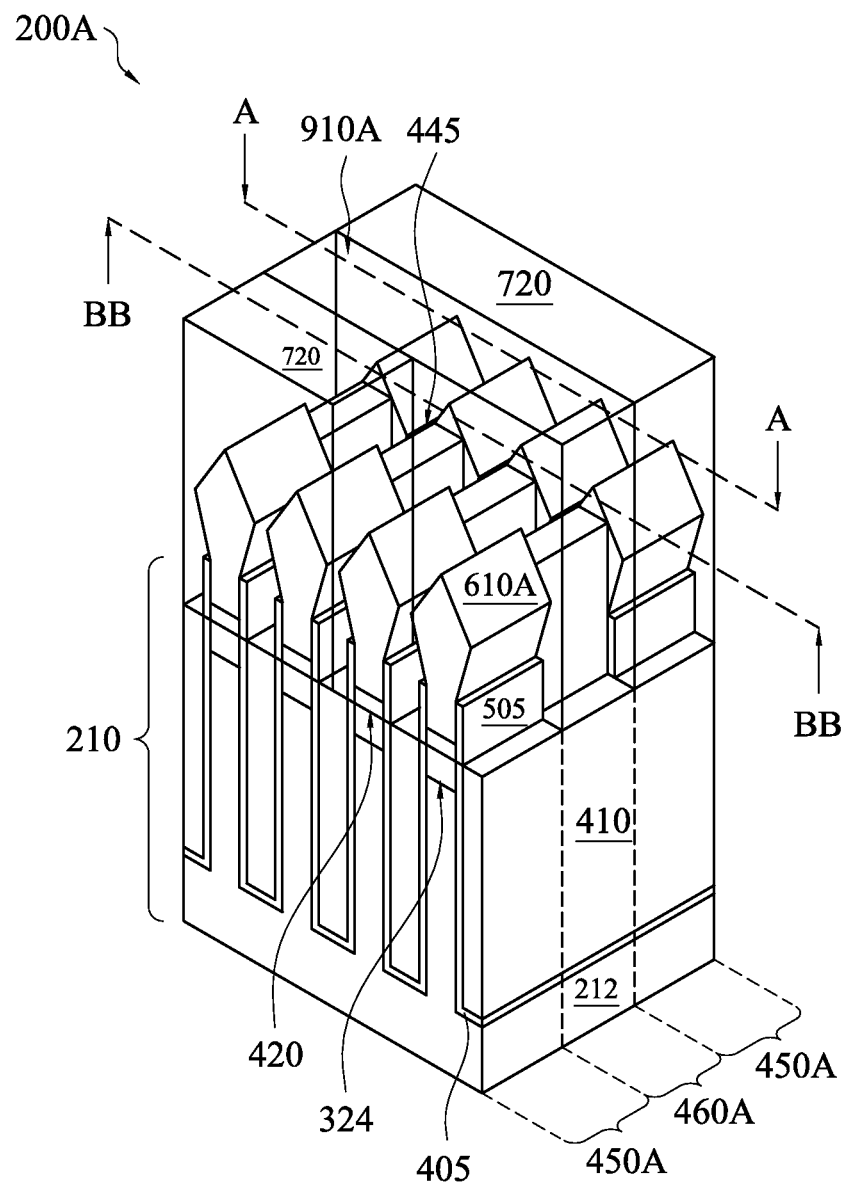
Figure 11B:
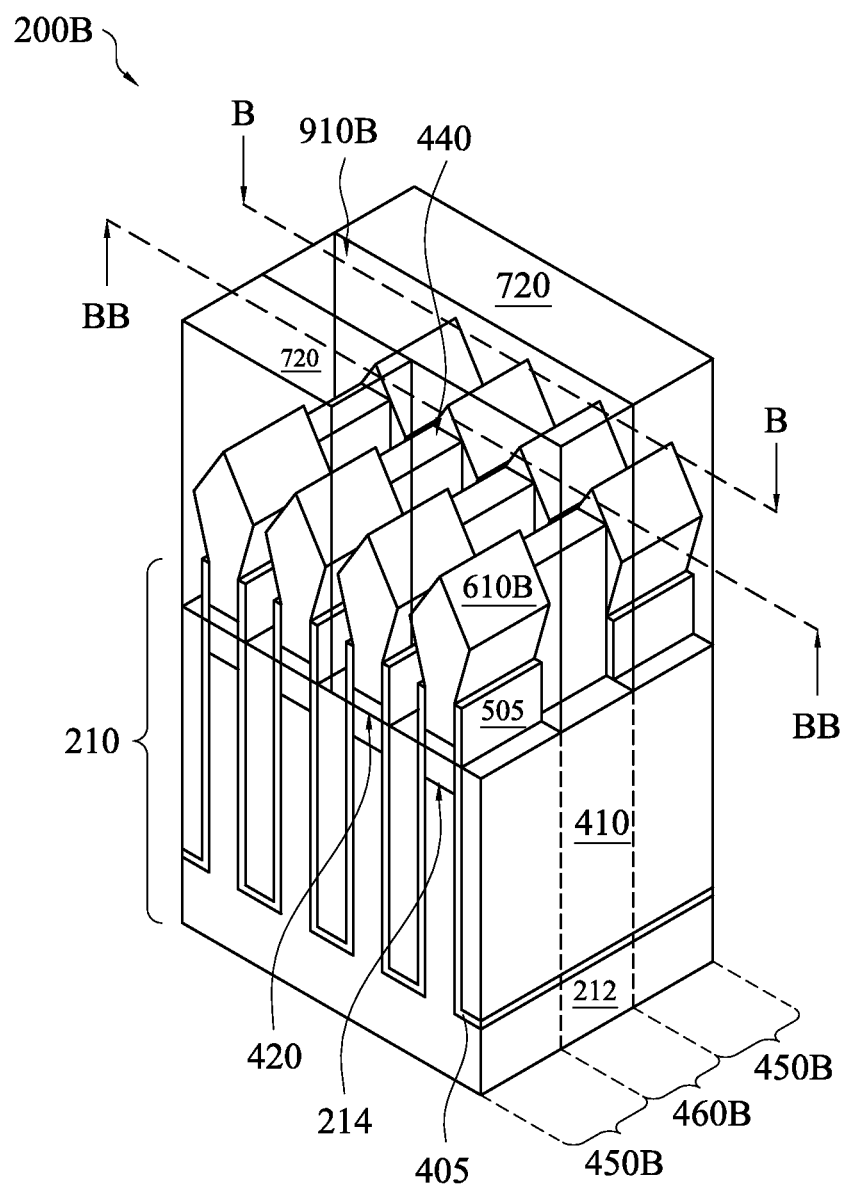

Referring to FIGS. 1 and 11A-11B, the method 1000 proceeds to step 1024 by forming a first and a second high-k/metal gate (HK/MG) stacks, 910A and 910B, over the substrate 210, including wrapping over a portion of the fourth fin structures 445 in the first gate trench 810A and a portion of the third fin structure 440 in the second gate trench 810B, respectively. The first and the second HK/MG stack, 910A and 910B, include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the first and the second HK/MG stacks, 910A and 910B, includes depositions to form various gate materials and a CMP process to remove the excessive gate materials and planarize the top surface of the NFET device 200A and the PFET device 200B.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, Si$_3$N$_4$, oxynitrides (SiON), or other suitable materials. The gate dielectric layers wrap over the upper portion of the second fin structures 320 in the first gate region 460A and the upper portion of the third fin structures 440 in the second gate region 460B.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the NFET 200A and the PFET 200B with different metal layers. A CMP process may be performed to remove excessive MG electrode.

Figure 11C:
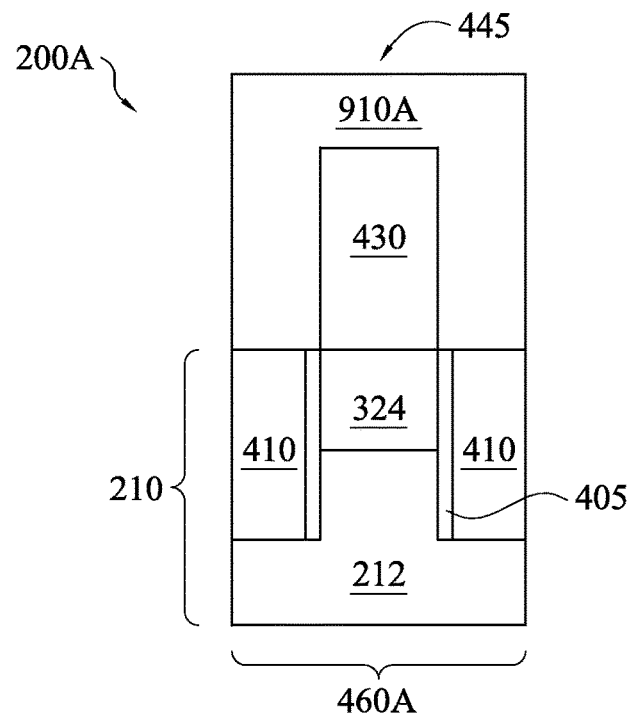
FIG. 11C is a cross-sectional view of an example FinFET device along the line A-A in FIG. 11A at fabrication stages constructed according to the method of FIG. 1.
Figure 11D:
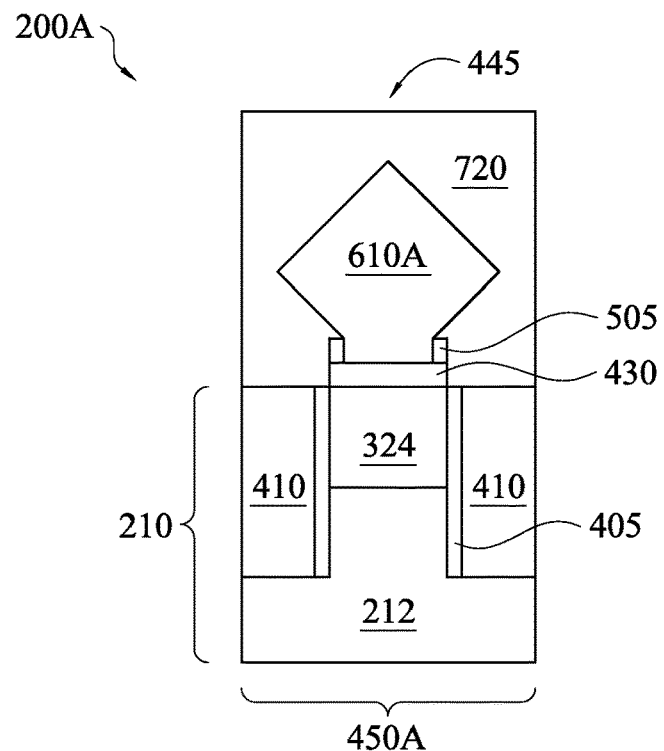
FIG. 11D is a cross-sectional view of an example FinFET device along the line AA-AA in FIG. 11A at fabrication stages constructed according to the method of FIG. 1.

Referring to FIGS. 11C and 11D, in the NFET device 200A, the first gate region 460A includes the first HM/MG 910A, which wraps over the upper portion of the fourth fin structure 445. The fourth fin structure 445 includes the Ge feature 430 as its upper portion, the semiconductor oxide layer 324 as its middle portion, and the first semiconductor material layer 212 as its bottom portion. Therefore, during forming the semiconductor oxide layer 324 in the fourth fin structure 445, a proper strain is induced to the first gate region 460A and it will increase electron mobility in a channel region in the first gate region 460A. The liner 405 covers sidewalls of the bottom and middle portion of the fourth fin structures 445. The semiconductor oxide layer 324 also isolates the Ge feature 430 from the first semiconductor material layer 212 to avoid its adverse impacts. The first S/D region 450A includes SiGeP S/D features 610A over a recessed Ge feature 430, which provides an epitaxial seed layer.

Figure 11E:
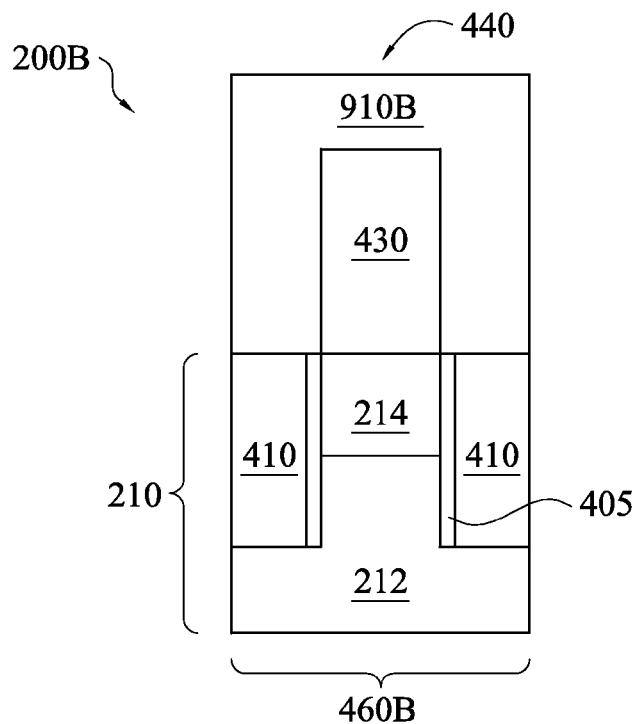
FIG. 11E is a cross-sectional view of an example FinFET device along the line B-B in FIG. 11B at fabrication stages constructed according to the method of FIG. 1.
Figure 11F:
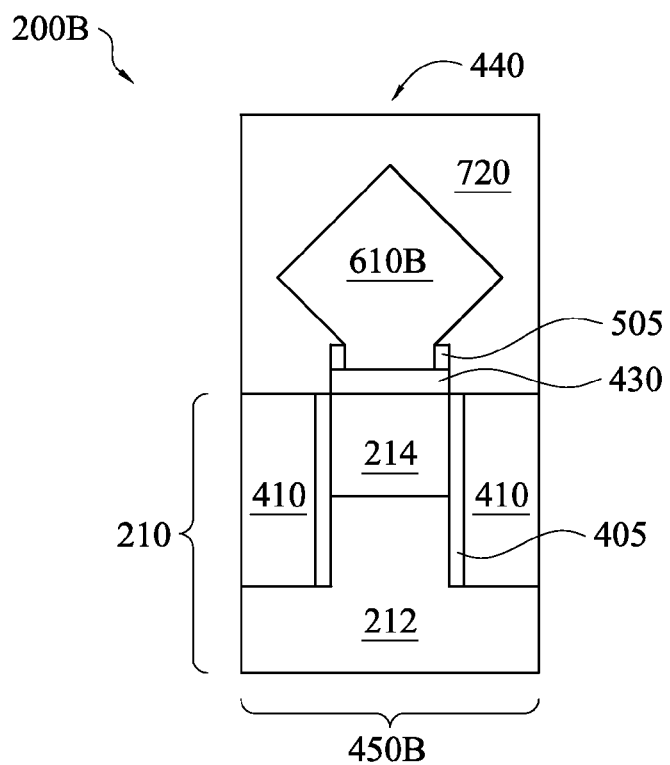
FIG. 11F is a cross-sectional view of an example FinFET device along the line BB-BB in FIG. 11B at fabrication stages constructed according to the method of FIG. 1.

Referring to FIGS. 11E and 11F, in the PFET device 200B, the second gate region 460B includes the second HM/MG 910B, which wraps over the upper portion of the third fin structure 440. The third fin structure 440 includes the Ge feature 430 as its upper portion, the SiGe layer 214 as its middle portion, and the first semiconductor material layer 212 as its bottom portion. The liner 405 covers sidewalls of the bottom and middle portion of the third fin structures 440. The second S/D region 450B includes GeSnB S/D features 610B over a recessed Ge feature 430, which provides an epitaxial seed layer. Alternatively, the second S/D region 450B includes SiGeSn S/D features.

The disclosure also discusses several different embodiments of a FinFET device 200, as shown in FIGS. 12, 13A-13B, 14A-14B, 15A-15B, 16A-16B, 17A-17B and 18A-18D, manufactured according to a method 2000. The present disclosure repeats reference numerals and/or letters in the various embodiments. This repetition is for the purpose of simplicity and clarity and does not in itself dictate a relationship between the various embodiments and/or configurations discussed.

Figure 13A:
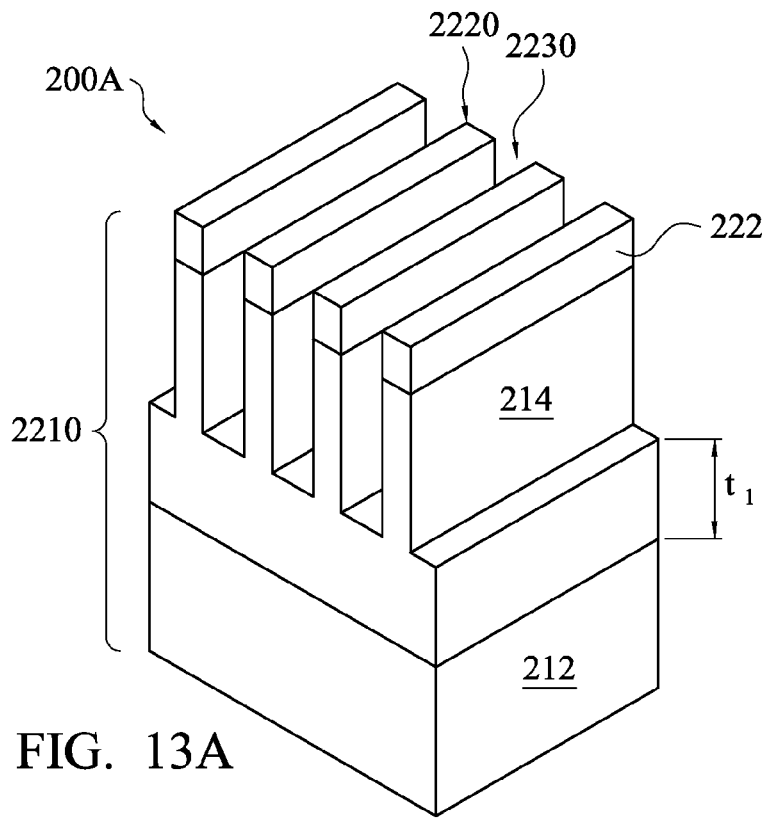
FIGS. 13A-13B, 14A-14B, 15A-15B, 16A-16B, 17A-17B and 18A-18B are diagrammatic perspective views of a FinFET device undergoing processes in accordance with some embodiments.
Figure 13B:
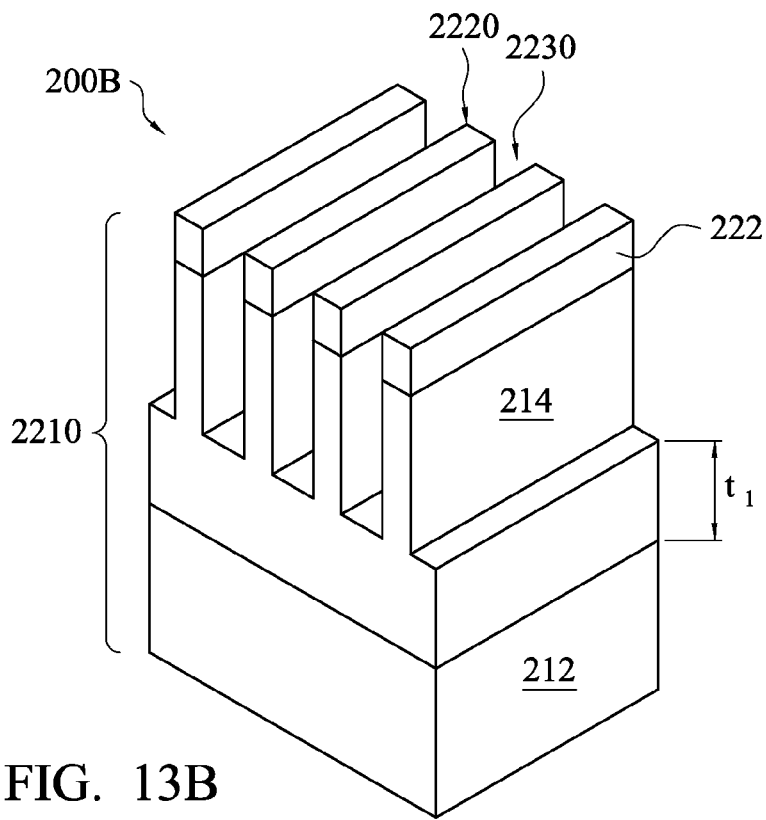

Referring to FIGS. 11 and 13A-13B, the method 2000 begins at step 2002 by forming fifth fin structure 2220 and trenches 2230 in a substrate 2210 in the NFET 200A and the PFET 200B. The substrate 2210 the second semiconductor material layer 214 over the first semiconductor material layer 212 and the patterned FHM 222. The fifth fin structure 22220 and the trench 2230 are formed by produces such as lithography and etch processes. A formation of the fifth fin structures 2220 and the trenches 2230 are similar in many respects to those discussed above the first fin structure 220 in association with FIG. 2. A depth of the etching process is controlled that a remaining of the second semiconductor material layer 214 has a first thickness $t_1$.

Figure 12:
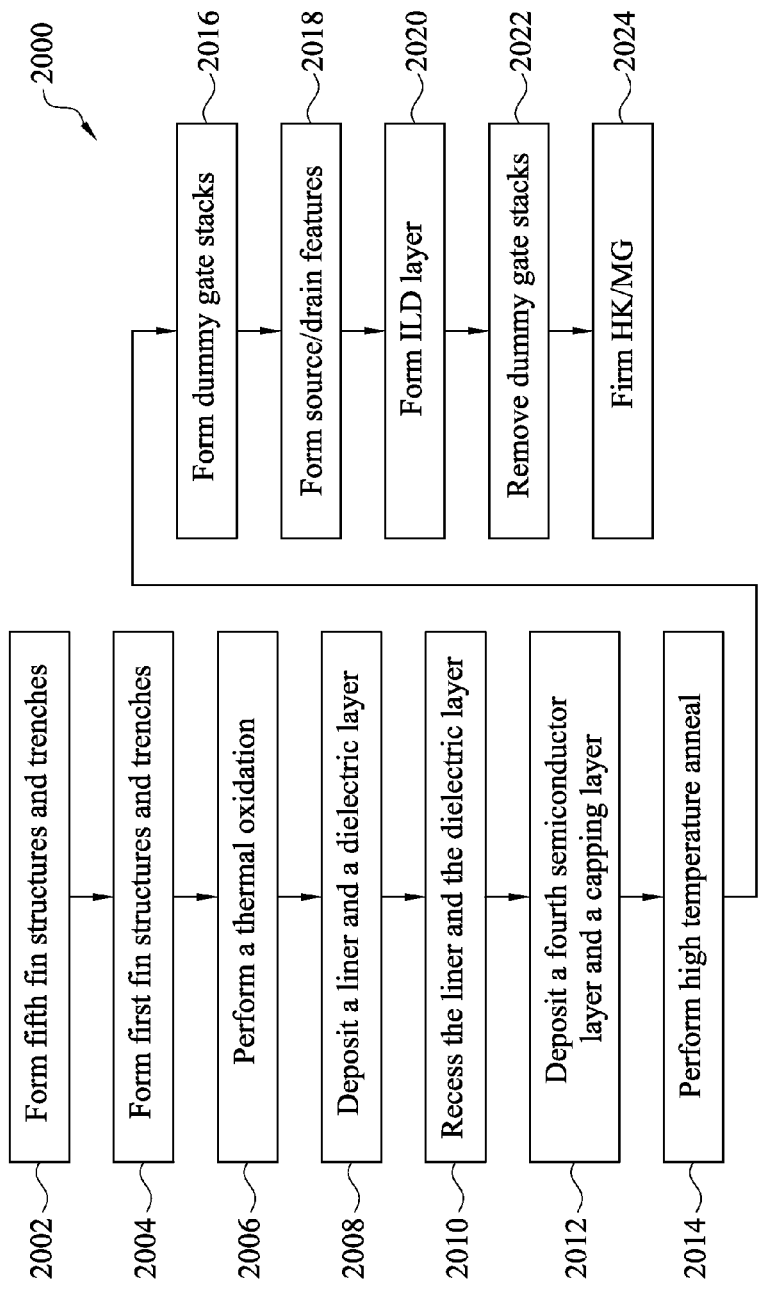
FIG. 12 is another flow chart of an example method for fabricating a FinFET device in accordance with some embodiments.
Figure 14A:
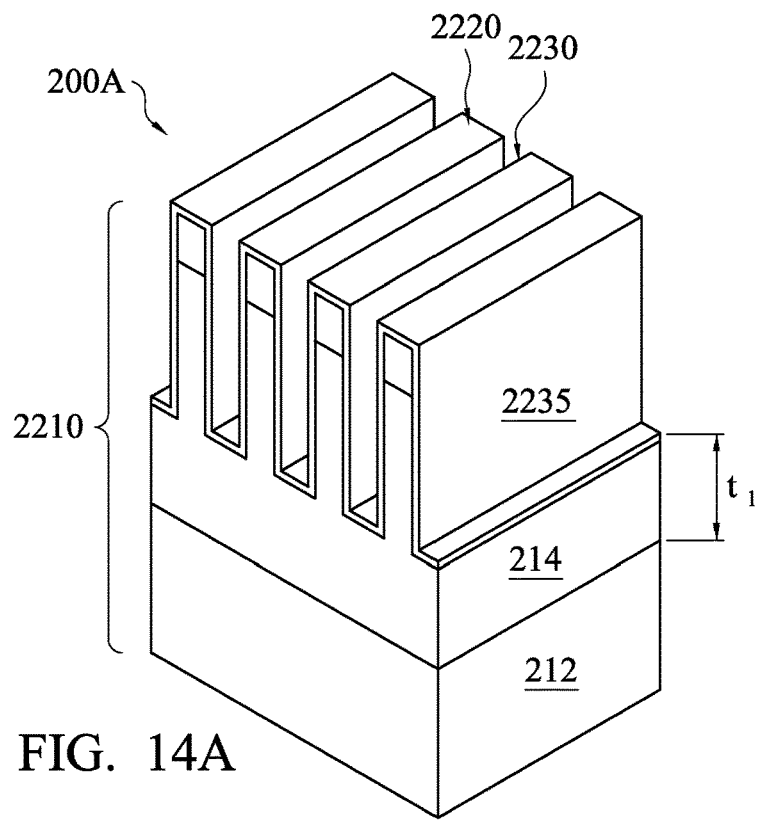
Figure 14B:
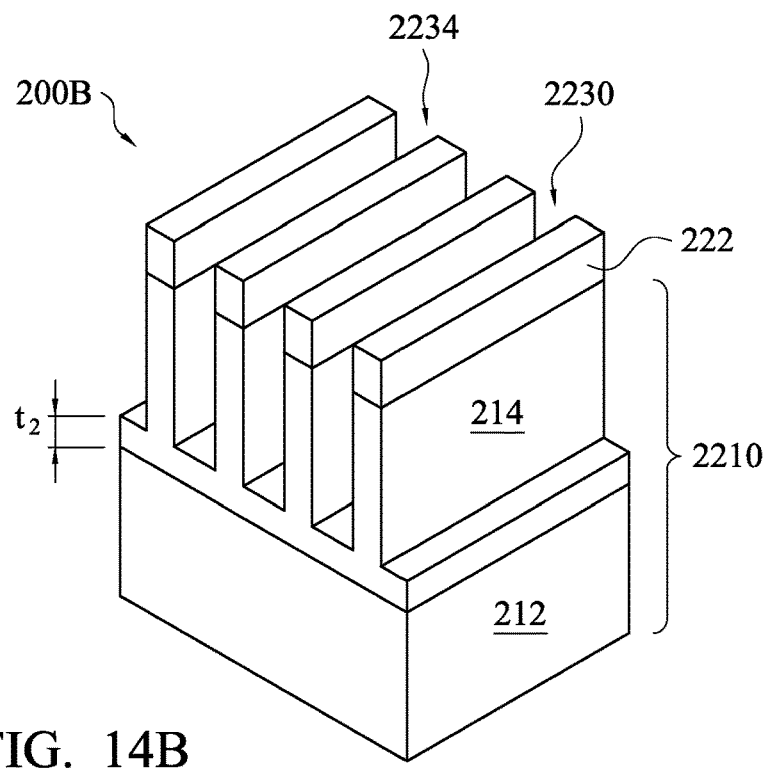

Referring to FIGS. 12 and 14A, the method 2000 proceeds to step 2004 by extending the depth of trench 2230 in the PFET 200B by removing a portion of second semiconductor material layer 214. As shown, after the trenches 2230 in the PFET device 200B are extended (or recessed further) a portion of second semiconductor material layer 214 remains in the PFET device 200B and has a second thickness $t_2$. For the sake of clarity to better description, the fifth fin structures 2220 in the PFET are referred to as a sixth fin structures 2234.

Additionally, step 2004 includes forming a second FHM 2235 over the NFET device 200A prior to extending the trenches 2230 in the PFET device 200B. As shown in FIG. 14A, the second FHM 2235 wraps over the fifth fin structures 2220 of the NFET device 200A. The second FHM 2235 is similar in many respects to the FHM 222 discussed above in association with FIG. 2.

Figure 15A:
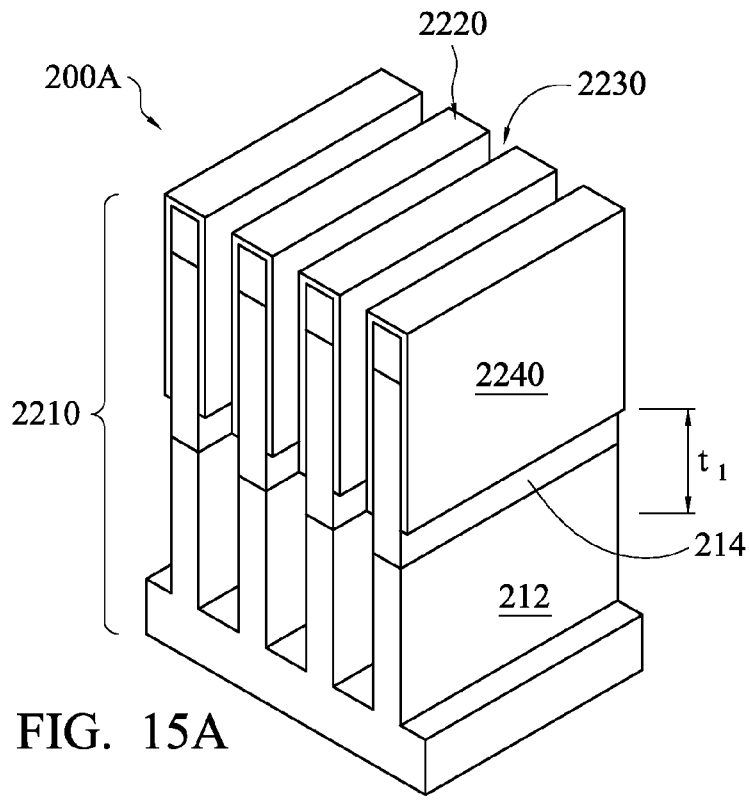
Figure 15B:
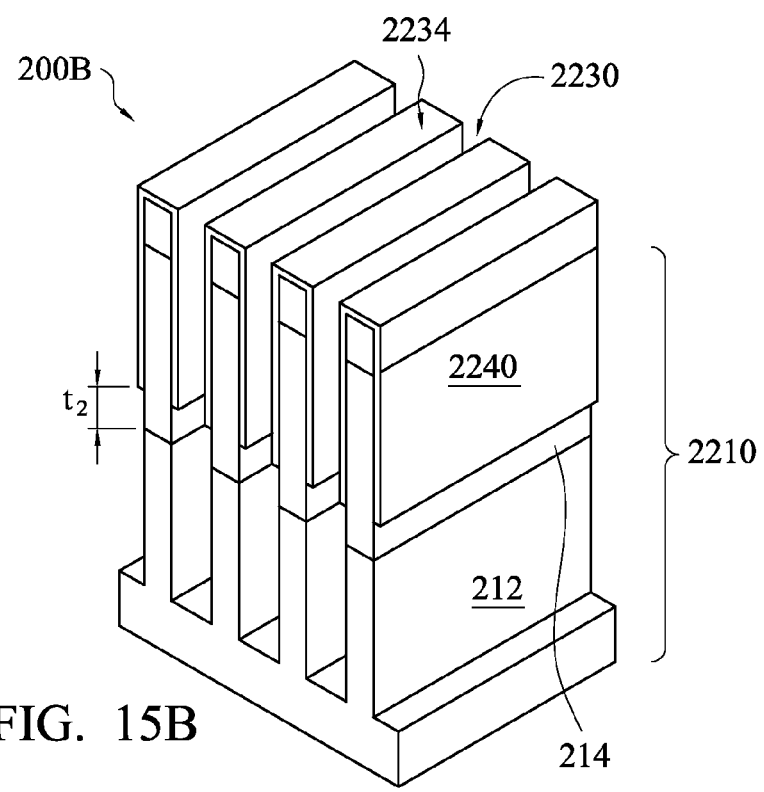

Referring to FIGS. 12 and 15A-15B, the method 2000 proceeds to step 2006 by forming a third FHM 2240 over the substrate 2210 and recessing the trenches 2230 further. The third FHM 2240 is formed in both of the NFET device 200A and the PFET device 200B, including wrapping over the fifth and sixth fin structures, 2220 and 2234. The third FHM 2240 is similar in many respects to the FHM 222 discussed above in association with FIG. 2. The trenches 2230 in both of the NFET device 200A and the PFET device 200B are recessed further to extend to the first semiconductor material layer 212. Therefore, a portion of the second semiconductor material layer 214 is exposed in the extended trench 2230 in both of the NFET device 200A and PFET device 200B.

Figure 16A:
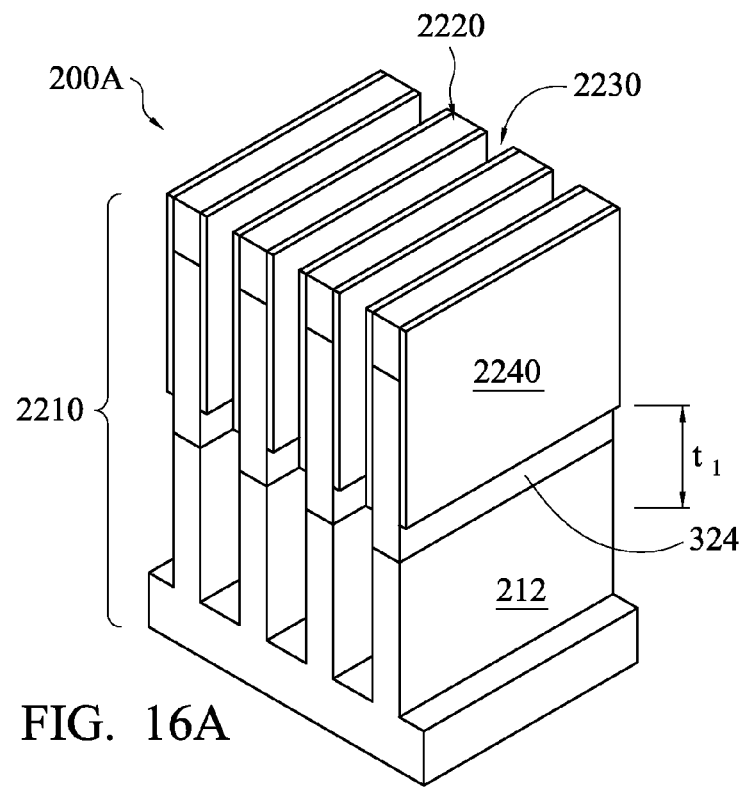
Figure 16B:
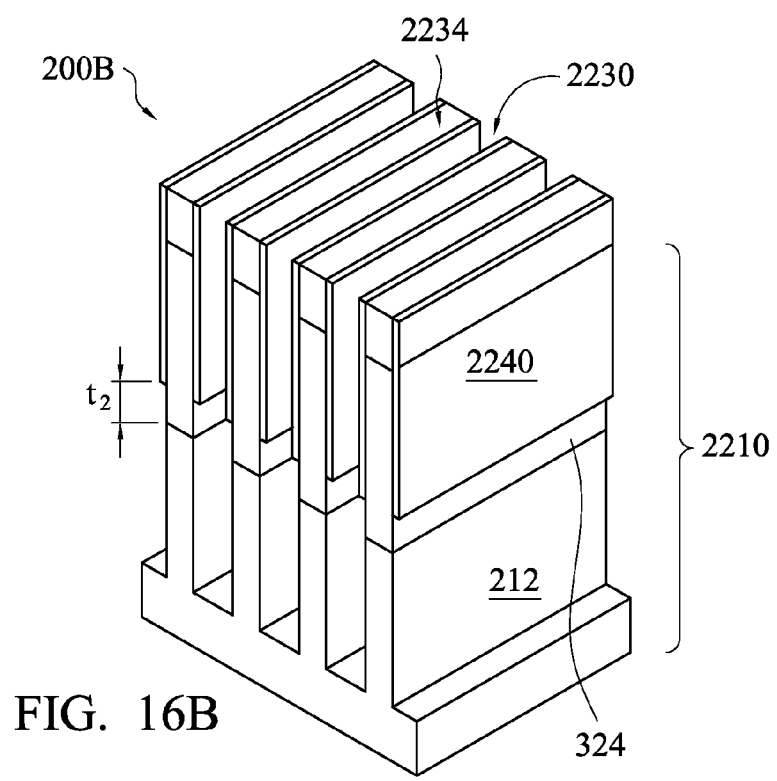

Referring to FIGS. 12 and 16A-16B, the method 2000 proceeds to step 2008 by converting the exposed second semiconductor material layer 214, in both the NFET device 200A and PFET device 200B, into a semiconductor oxide layer 324. Step 2008 is similar in many respects to the step 1006 of the method 1000 discussed above in association with FIGS. 3A-3B. After forming the semiconductor oxide layer 324, the third FHM 2240 is removed by a suitable etch process.

Referring to FIG. 12, the method 2000 proceeds to step 2010 by depositing a liner 405 and then filling in the trench 230 with a dielectric layer 410 over the substrate 210, in both of the NFET 200A and the PFET 200B. The step 2010 is similar in many respects to the step 1008 of the method 1000 discussed above in association with FIGS. 4A-4B.

Figure 17A:
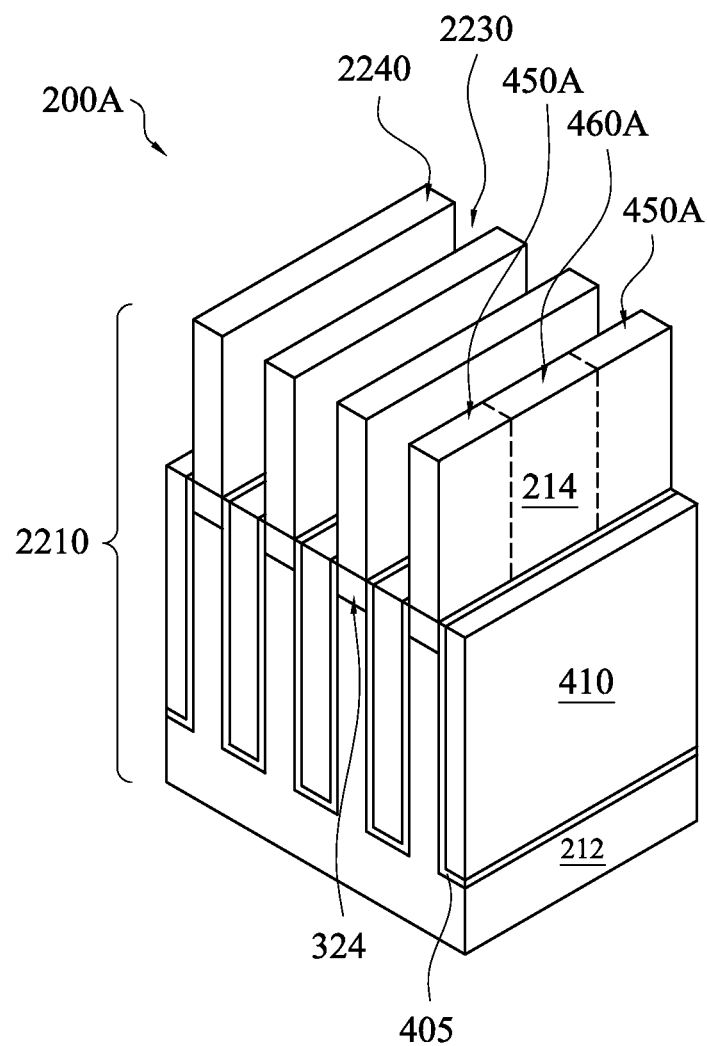
Figure 17B:
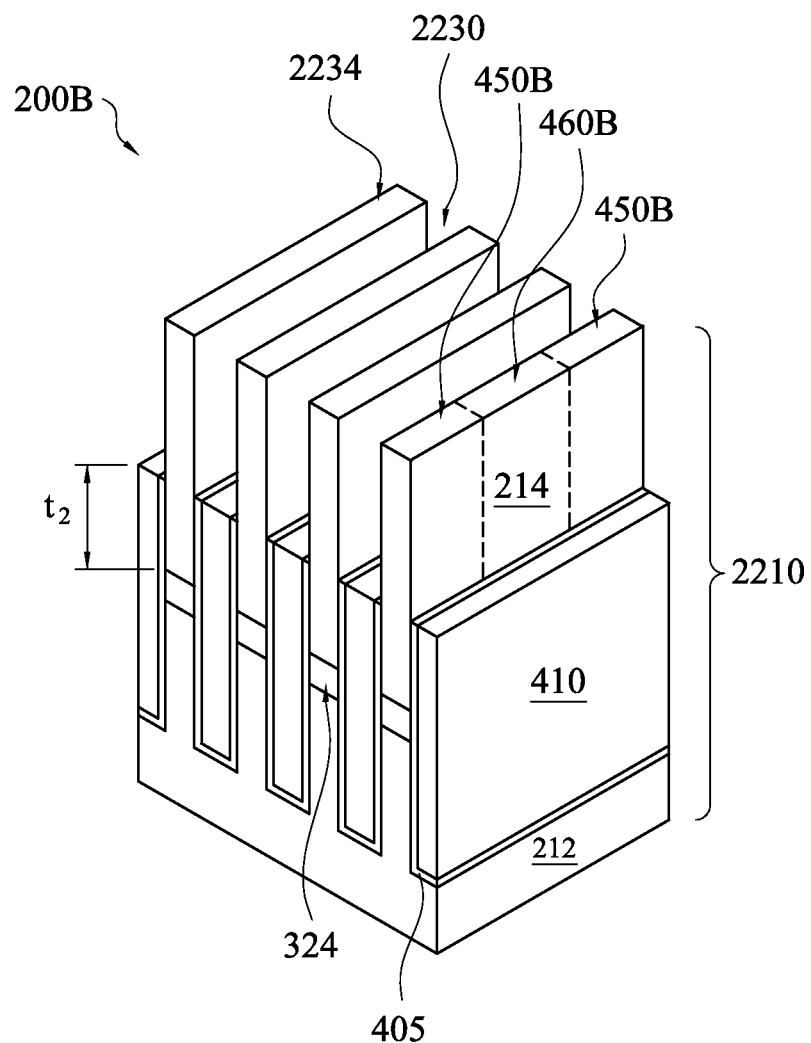

Referring to FIGS. 12 and 17A-17B, the method 2000 proceeds to step 2012 by recessing the liner 405 and the dielectric layer 410 in both of the NFET device 200A and the PFET device 200B. The step 2012 is similar in many respects to the step 1010 of the method 1000. In the PFET device 200B, the second semiconductor material layer 214 is partially exposed, which forms an upper portion of the sixth fin structure 2234, while the un-exposed second semiconductor material layer 214 forms an upper section of a middle portion and the semiconductor oxide layer 324 forms a lower section of the middle portion and the first semiconductor material layer 212 forms a bottom portion. In the NFET device 200A, the second semiconductor material layer 214 is fully exposed, which forms an upper portion of a seven fin structure 2440 while the semiconductor oxide layer 324 forms a middle portion and the first semiconductor material layer 212 forms a bottom portion.

The S/D regions are separated by the gate region. For the sake of clarity to better description, the S/D regions and the gate regions in the NFET device 200A are referred to as the first S/D regions 450A and the first gate regions 460A; the S/D regions and the gate regions in the PFET device 200B are referred to as the second S/D regions 450B and the second gate regions 460B.

Referring to FIG. 12, the method 2000 proceeds to step 2014 by wrapping over the exposed second semiconductor material layer 214 in the sixth and seventh fin structures, 2234 and 2440, by the fourth semiconductor material layer 420 and an oxide capping layer 425 over the fourth semiconductor material layer 420. The step 2014 is similar in many respects to the step 1012 of the method 1000 discussed above in association with FIGS. 6A-6B.

Referring to FIG. 12, the method 2000 proceeds to step 2016 by performing a high temperature anneal to form Ge features 430 as a center section 435 and an oxide layer 436 as outer layers of the upper portion of the sixth and seventh fin structures, 2234 and 2440. The oxide outer layers 436 are removed later by a proper etching process. The step 2016 is similar in many respects to the step 1014 of the method 1000 discussed above in association with FIGS. 7A-7D.

Referring to FIG. 12, the method 2000 proceeds to step 2018 by forming a gate stack 510 and sidewall spacers 520 on sidewalls of the gate stack 510, in the first and second gate regions, 460A and 460B. The step 2018 is similar in many respects to the step 1016 of the method 1000 discussed above in association with FIGS. 8A-8B.

Referring to FIG. 12, the method 2000 proceeds to step 2020 by forming the first S/D features 610A in the first S/D regions 450 A and the second S/D features 610B in the second S/D regions 450B. The step 2020 is similar in many respects to the step 1018 of the method 1000 discussed above in association with FIGS. 9A-9B.

Referring to FIG. 12, the method 2000 proceeds to step 2022 by forming the interlayer dielectric (ILD) layer 720 on the substrate 210 between the gaps of the dummy gate stacks 510. The step 2022 is similar in many respects to the step 1020 of the method 1000 discussed above in association with FIGS. 10A-10B.

Referring to FIG. 12, the method 2000 proceeds to step 2024 by removing the dummy gate stacks 510 in the first gate region 460A to form one or more first gate trench 810A and in the second gate region 460B to form one or more second gate trench 810B. The step 2024 is similar in many respects to the step 1022 of the method 1000 discussed above in association with FIGS. 10A-10B.

Figure 18A:
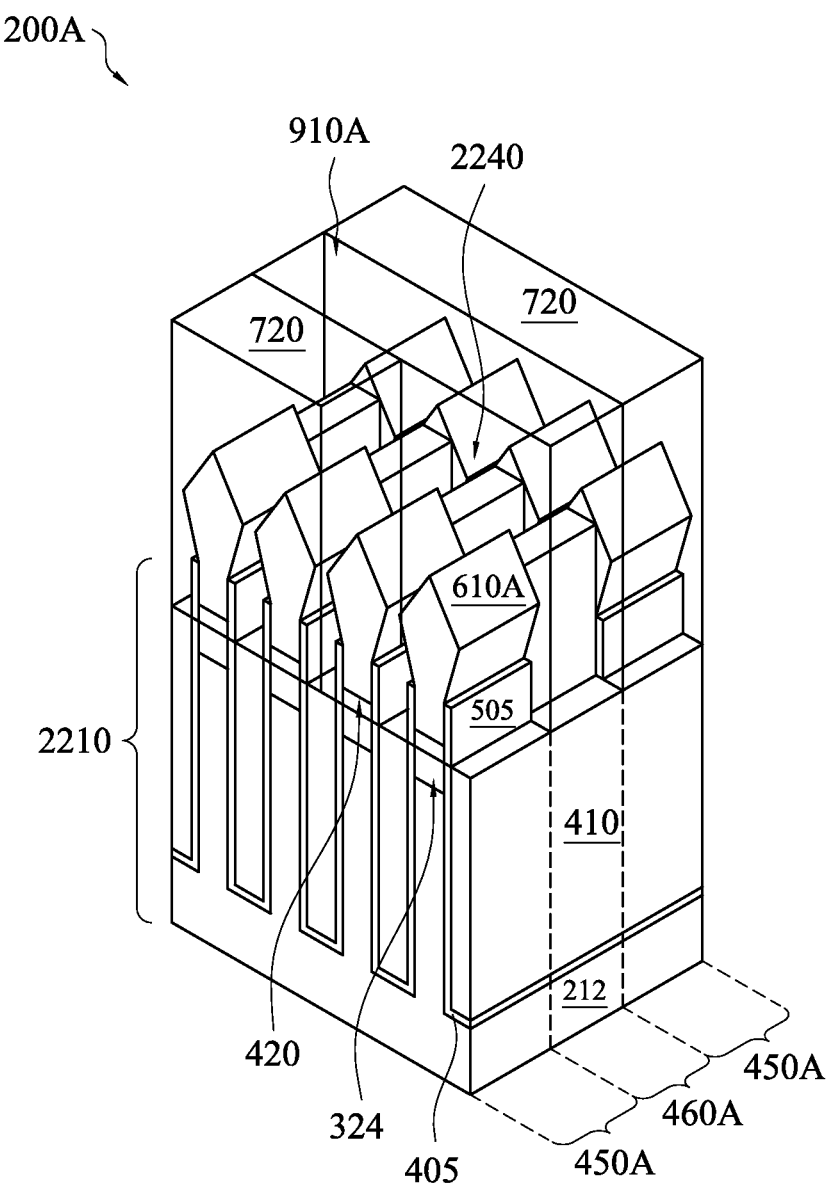
Figure 18B:
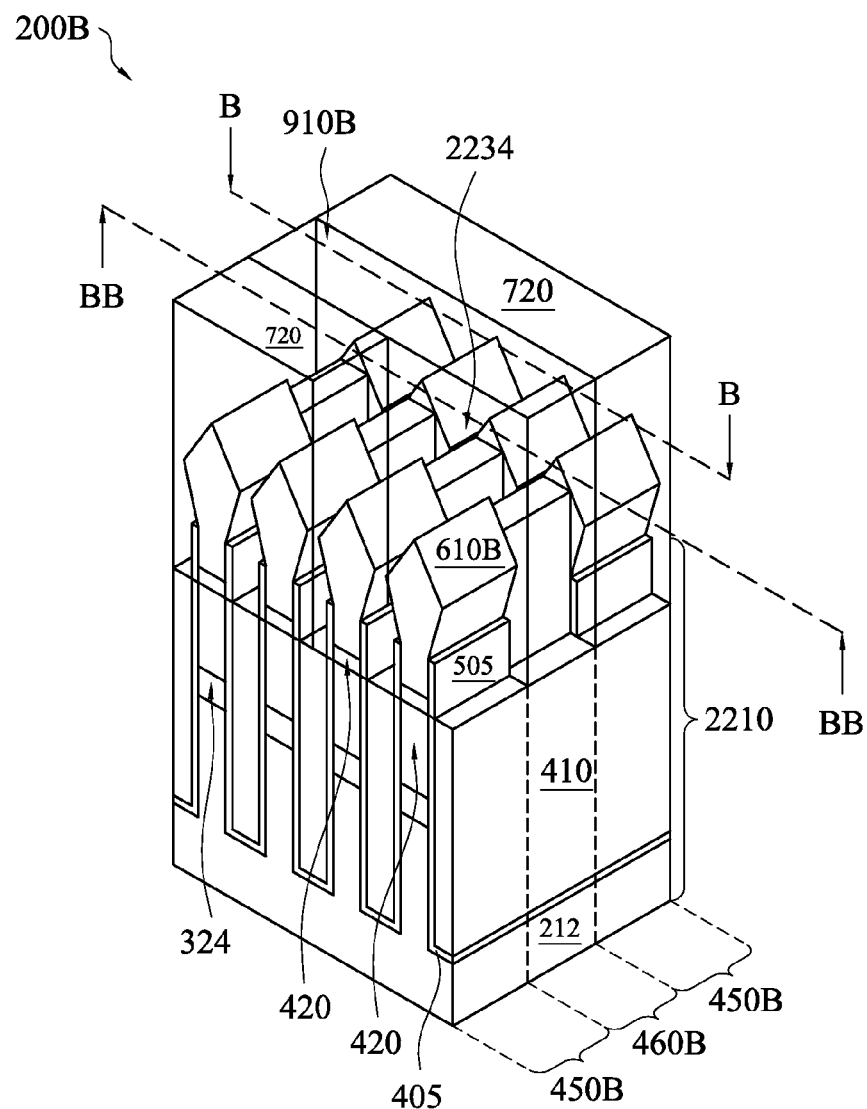

Referring to FIGS. 12 and 18A-18B, the method 2000 proceeds to step 2026 by removing the dummy gate stacks 510 in the first gate region 460A to form one or more first gate trench 810A and in the second gate region 460B to form one or more second gate trench 810B. The step 2026 is similar in many respects to the step 1024 of the method 1000.

Figure 18C:
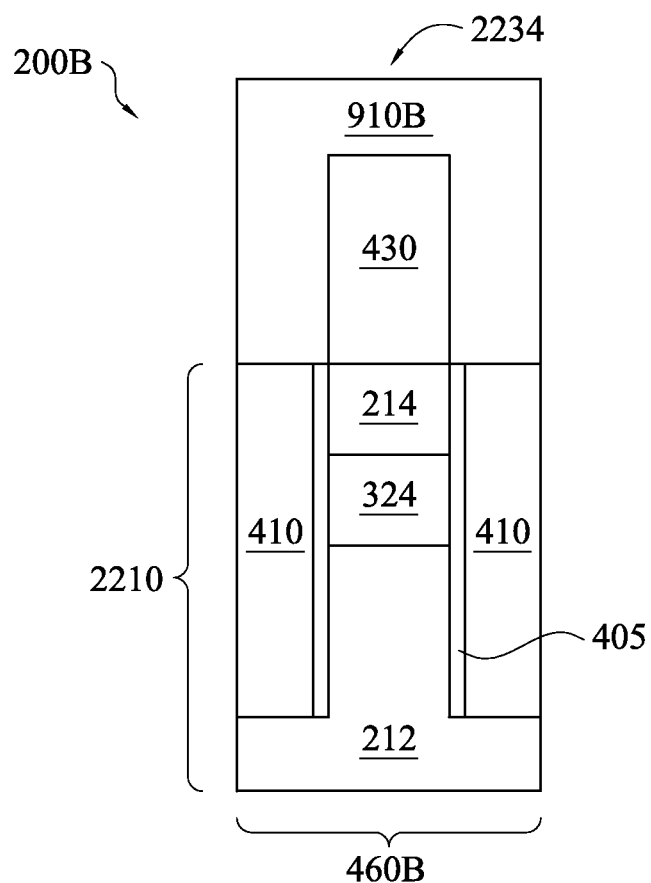
FIG. 18C is a cross-sectional view of an example FinFET device along the line B-B in FIG. 18B at fabrication stages constructed according to the method of FIG. 12.
Figure 18D:
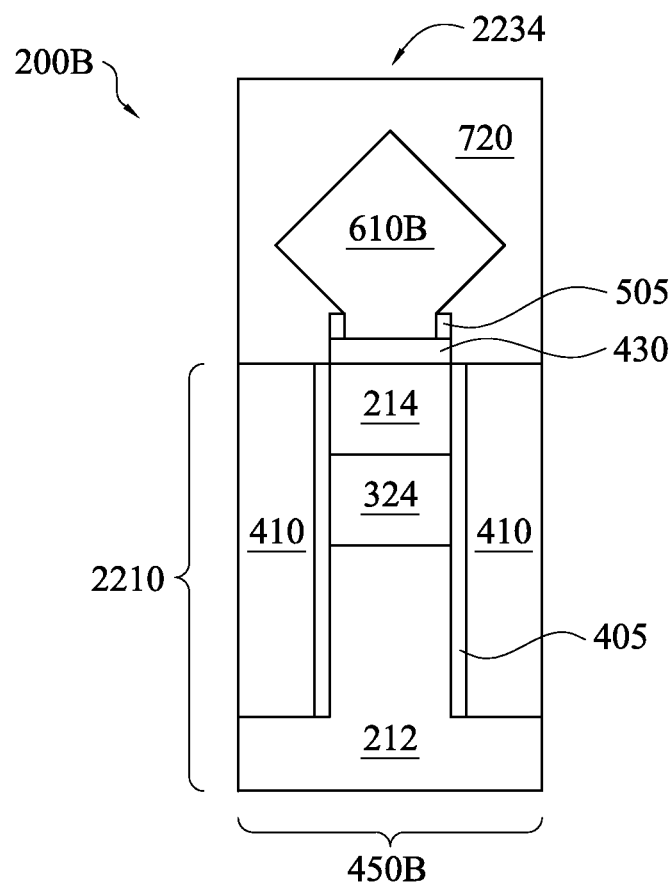
FIG. 18D is a cross-sectional view of an example FinFET device along the line BB-BB in FIG. 18B at fabrication stages constructed according to the method of FIG. 12.

Referring to FIGS. 18C and 18D, in the PFET device 200B, the second gate region 460B includes the second HM/MG 910B, which wraps over the upper portion of the sixth fin structure 2234. The sixth fin structure 2234 includes the Ge feature 430 as its upper portion, the SiGe layer 214 as its upper section of the middle portion, the semiconductor oxide layer 324 as its lower section of the middle portion, and the first semiconductor material layer 212 as its bottom portion. The liner 405 covers sidewalls of the bottom and middle portion of the third fin structures 430. The SiGe layer 214 in the sixth fin structure 2234 (the upper section of the middle portion) provides a proper strain to the second gate region 460B to enhance channel mobility in a channel region in the second gate region 460B. The semiconductor oxide layer 324 (the lower section of the middle portion) isolates the Ge feature 430 from the first semiconductor material layer 212 to avoid its adverse impacts.

Additional operations may be implemented before, during, and after the method 100, and some operations described above may be replaced or eliminated for other embodiments of the method. For example, in one embodiment, the step 2004 is eliminated. Therefore, the sixth fin structure 2440 in the PFET device 200B is as same as the seventh fin structure 2445 in the NFET device 200A.

Based on the above, the present disclosure offers fin structures for a FinFET device. The fin structures employ pure Ge feature, as its upper portion, formed by condensing Ge from SiGe layer during a high temperature annealing to concentrate Ge to a center section of the upper portion. Instead of forming by an epitaxial growing, the Ge feature formed by condensing Ge provides advantages of low epi defects. The fin structures also employ a SiGeO layer to separate the Ge feature away from a Si layer, a lower portion of the fin structure, to reduce adverse substrate impact. In a PFET device, the fin structures employ a SiGe layer between the Ge feature and the SiGeO layer to provide reasonable compressive channel strain. The fin structures also employ a thin SiGe layer as epitaxial seed layer for S/D feature formation. The fin structure demonstrates device performance improvements.

The present disclosure provides an embodiment of a semiconductor device. The device includes a first fin structure disposed over an n-type FinFET (NFET) region of a substrate. The first fin structure includes a silicon (Si) layer, a silicon germanium oxide (SiGeO) layer disposed over the silicon layer and a germanium (Ge) feature disposed over the SiGeO layer. The device also includes a second fin structure over the substrate in a p-type FinFET (PFET) region. The second fin structure includes the silicon (Si) layer, a recessed silicon germanium oxide (SiGeO) layer disposed over the silicon layer, an epitaxial silicon germanium (SiGe) layer disposed over the recessed SiGeO layer and the germanium (Ge) feature disposed over the epitaxial SiGe layer.

The present disclosure also provides another embodiment of a fin-like field-effect transistor (FinFET) device. The device includes a substrate having an n-type FinFET (NFET) and a p-type FinFET (PFET) region. The device also includes a first fin structure over the substrate in the NFET region. The first fin structure includes a germanium (Ge) layer as its upper portion, a silicon germanium oxide (SiGeO) layer as its middle portion and a silicon (Si) layer as its bottom portion. The device also includes a second fin structure over the substrate in the PFET region. The second fin structure includes the germanium (Ge) layer as its upper portion, an epitaxial silicon germanium (SiGe) layer as its middle portion and the silicon (Si) layer as its bottom portion. The device also includes a high-k (HK)/metal gate (MG) stack over the substrate in the NFET region, including wrapping over the upper portion of a portion of the first fin structure, a first source/drain (S/D) features, separated by the HK/MG stack, over the recessed upper portion of the first fin structure, the high-k (HK)/metal gate (MG) stack over the substrate in the PFET region, including wrapping over the upper portion of a portion of the second fin structure, a second source/drain (S/D) features, separated by the HK/MG stack, over the recessed upper portion of the second fin structure.

The present disclosure also provides a method for fabricating a FinFET. The method includes providing a fin structure over a substrate. The fin structure includes a first semiconductor material layer as its bottom portion, a semiconductor oxide layer as its middle portion and a third epitaxial semiconductor material layer as its upper portion. The method also includes depositing germanium-containing semiconductor material layer over the fin structure, depositing an oxide layer over the germanium-containing semiconductor material layer, applying a high temperature annealing to concentrate germanium (Ge) in a center portion of the upper portion and semiconductor oxide in an outer portion of the upper portion of the fin structure and removing the semiconductor oxide of the outer portion of the upper portion of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a semiconductor fin structure, the semiconductor fin structure containing a bottom segment, a middle segment disposed over the bottom segment, and a top segment disposed over the middle segment, wherein a material composition of the middle segment is different from a material composition of the top segment;
    converting a semiconductor material of the middle segment into a dielectric material;
    after the converting, forming a semiconductor layer on the top segment but not on the middle segment or the bottom segment, so that the semiconductor layer is in direct contact with the top segment and wraps around the top segment but is not in direct contact with the middle segment or the bottom segment, wherein the semiconductor layer and the top segment have different material compositions; and
    replacing a semiconductor material of at least a portion of the top segment with a different semiconductor material.

2. The method of claim 1, wherein the forming of the semiconductor fin structure is performed such that the middle segment of the semiconductor fin structure contains silicon germanium, and the bottom segment and the top segment of the semiconductor fin structure each contain silicon.

3. The method of claim 2, wherein the converting of the semiconductor material of the middle segment comprises performing a thermal oxidation process to convert the silicon germanium into silicon germanium oxide.

4. The method of claim 1, wherein the forming of the semiconductor layer comprises forming a germanium layer or a silicon germanium layer as the semiconductor layer.

5. The method of claim 4, wherein the replacing of the semiconductor material of at least a portion of the top segment comprises an annealing process to condense germanium from the semiconductor layer into the top segment.

6. The method of claim 5, wherein the annealing process is performed at a temperature in a range from about 800 degrees Celsius to about 1100 degrees Celsius.

7. The method of claim 5, further comprising: forming a dielectric capping layer over the semiconductor layer before the annealing process is performed, wherein the annealing process causes a dielectric material to form in an outer portion of the top segment and germanium to form in an inner portion of the top segment.

8. The method of claim 1, further comprising:
    forming a gate structure over the semiconductor fin structure after the replacing of the semiconductor material, wherein the gate structure is formed to wrap around the top segment; and
    forming source/drain regions on opposite sides of the gate structure.

9. The method of claim 8, wherein the forming of the gate structure comprises:
    forming a dummy gate electrode before the forming of the source/drain regions; and
    replacing the dummy gate electrode with a metal gate electrode after the forming of the source/drain regions.

10. The method of claim 8, wherein the forming of the source/drain regions comprises:
    removing a portion of the different semiconductor material of the top segment; and
    epitaxially growing the source/drain regions on a remaining portion of the different semiconductor material of the top segment.

11. The method of claim 1, wherein the forming the semiconductor fin structure comprises forming the top segment as a topmost segment of the semiconductor fin structure.

12. A method of fabricating a semiconductor device, comprising:
    forming a semiconductor fin structure, the semiconductor fin structure including a bottom segment containing a first semiconductor material, a middle segment containing a second semiconductor material disposed over the bottom segment, and a top segment containing a third semiconductor material disposed over the middle segment, wherein the third semiconductor material is different from the second semiconductor material;
    converting, via a thermal oxidation process, the second semiconductor material of the middle segment into a dielectric material;
    transforming, via an annealing process, the third semiconductor material of at least a portion of the top segment into a fourth semiconductor material;
    thereafter forming a dummy gate to wrap around the top segment;
    removing a portion of the fourth semiconductor material;
    forming, via an epitaxial growth process, source/drain regions on an un-removed portion of the fourth semiconductor material and on opposite sides of the dummy gate, wherein the un-removed portion of the fourth semiconductor material serves as a seeding layer during the epitaxial growth process; and
    replacing, after the source/drain regions have been formed, the dummy gate with a gate that includes a metal gate electrode.

13. The method of claim 12, wherein:
    the forming of the semiconductor fin structure is performed such that the first and third semiconductor materials include silicon, and the second semiconductor material includes silicon germanium; and
    the converting of the second semiconductor material of the middle segment comprises oxidizing the silicon germanium into silicon germanium oxide.

14. The method of claim 12, further comprising: forming a semiconductor layer to wrap around the top segment, the semiconductor layer containing the fourth semiconductor material.

15. The method of claim 14, wherein the forming of the semiconductor layer comprises forming a germanium-containing material as the fourth semiconductor material.

16. The method of claim 15, wherein:
the annealing process condenses germanium from the semiconductor layer into an inner portion of the top segment; and
the annealing process is performed at a temperature in a range from about 800 degrees Celsius to about 1100 degrees Celsius;
and further comprising: forming a silicon oxide capping layer to wrap around the germanium-containing material before the annealing process is performed, wherein the annealing process causes silicon oxide to form in an outer portion of the top segment.

17. A method, comprising:
forming a fin structure over a substrate; the fin structure including:
a first semiconductor material layer as its bottom portion;
a first oxide layer as its middle portion; and
a second semiconductor material layer as its upper portion;
depositing a germanium-containing semiconductor material layer directly on the second semiconductor material layer, wherein the germanium-containing semiconductor material layer is deposited to wrap around the second semiconductor material layer;
depositing a second oxide layer over the germanium-containing semiconductor material layer;
applying an annealing process to condense germanium (Ge) in a center section of the upper portion and semiconductor oxide in an outer portion of the upper portion of the fin structure; and
removing the semiconductor oxide of the outer portion of the upper portion of the fin structure.

18. The method of claim 17, wherein:
the first semiconductor material layer includes silicon;
the first oxide layer includes silicon germanium oxide (SiGeO);
the second semiconductor material layer includes Si; and
the germanium-containing semiconductor material layer includes germanium.

19. The method of claim 18, wherein the second oxide layer is deposited directly on the germanium-containing semiconductor material layer.

20. The method of claim 17, further comprising: forming a gate structure that wraps around at least the upper portion of the fin structure.

* * * * *